United States Patent
Kim et al.

(10) Patent No.: US 9,698,244 B2
(45) Date of Patent: Jul. 4, 2017

(54) SEMICONDUCTOR DEVICES AND METHODS OF FABRICATING THE SAME

(71) Applicant: SAMSUNG ELECTRONICS CO., LTD., Suwon-si, Gyeonggi-Do (KR)

(72) Inventors: Jinbum Kim, Seoul (KR); Jaeyoung Park, Yongin-si (KR); Donghun Lee, Daegu (KR); Jeongho Yoo, Seongnam-si (KR); Jieon Yoon, Hwaseong-si (KR); Kwan Heum Lee, Suwon-si (KR); Choeun Lee, Pocheon-si (KR); Bonyoung Koo, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/062,742

(22) Filed: Mar. 7, 2016

(65) Prior Publication Data

US 2016/0300929 A1    Oct. 13, 2016

(30) Foreign Application Priority Data

Apr. 10, 2015    (KR) .................... 10-2015-0050557

(51) Int. Cl.

| | | |
|---|---|---|
| *H01L 29/66* | (2006.01) | |
| *H01L 29/04* | (2006.01) | |
| *H01L 29/12* | (2006.01) | |
| *H01L 29/417* | (2006.01) | |
| *H01L 29/423* | (2006.01) | |
| *H01L 29/40* | (2006.01) | |
| *H01L 21/30* | (2006.01) | |

(52) U.S. Cl.
CPC .... *H01L 29/66636* (2013.01); *H01L 21/3003* (2013.01); *H01L 29/045* (2013.01); *H01L 29/12* (2013.01); *H01L 29/401* (2013.01); *H01L 29/41766* (2013.01); *H01L 29/42356* (2013.01); *H01L 29/66545* (2013.01)

(58) Field of Classification Search
CPC ................................. H01L 29/66636
See application file for complete search history.

(56) References Cited

U.S. PATENT DOCUMENTS

| | | |
|---|---|---|
| 7,273,818 B2 | 9/2007 | Kurokawa et al. |
| 7,550,370 B2 | 6/2009 | Chen et al. |
| 8,114,727 B2 | 2/2012 | Xiong et al. |
| 8,263,474 B2 | 9/2012 | Dip et al. |
| 8,361,852 B2 | 1/2013 | Jeong |
| 8,435,848 B2 | 5/2013 | Mehrotra |
| 8,623,729 B2 | 1/2014 | Jeong et al. |

(Continued)

FOREIGN PATENT DOCUMENTS

| | | |
|---|---|---|
| JP | 5361195 | 9/2013 |
| KR | 10-0891392 | 4/2009 |

(Continued)

*Primary Examiner* — Evren Seven
*Assistant Examiner* — S. M. S Imtiaz
(74) *Attorney, Agent, or Firm* — F. Chau & Associates, LLC

(57) ABSTRACT

A method of fabricating a semiconductor device is provided as follows. A source/drain pattern is formed on a substrate. The source/drain pattern contains silicon atoms and germanium atoms. At least one germanium atom is removed from the germanium atoms of the source/drain pattern.

18 Claims, 19 Drawing Sheets

(56) References Cited

U.S. PATENT DOCUMENTS

| | | |
|---|---|---|
| 8,647,953 B2 | 2/2014 | Liao et al. |
| 8,778,753 B2 | 7/2014 | Do et al. |
| 8,790,972 B2 | 7/2014 | Jeong et al. |
| 8,889,552 B2 | 11/2014 | Park et al. |
| 2005/0087801 A1* | 4/2005 | Lindert ............. H01L 29/66636 257/330 |
| 2006/0071275 A1* | 4/2006 | Brask ................... H01L 21/845 257/350 |
| 2007/0235819 A1* | 10/2007 | Yagishita ......... H01L 29/66636 257/401 |
| 2008/0048262 A1* | 2/2008 | Lee ................... H01L 29/41791 257/347 |
| 2008/0067609 A1* | 3/2008 | Kim ..................... H01L 29/165 257/384 |
| 2010/0035401 A1* | 2/2010 | Lai .................... H01L 21/28518 438/301 |
| 2011/0254105 A1* | 10/2011 | Cheng .............. H01L 21/30608 257/408 |
| 2011/0306170 A1 | 12/2011 | Wang et al. |
| 2012/0038006 A1* | 2/2012 | Zhu .................. H01L 29/66636 257/402 |
| 2012/0171864 A1 | 7/2012 | Akiyama et al. |
| 2013/0161642 A1* | 6/2013 | Zhu ................... H01L 29/66636 257/77 |
| 2014/0077264 A1 | 3/2014 | Chen |
| 2014/0084350 A1* | 3/2014 | Kim ....................... H01L 29/78 257/255 |
| 2015/0333172 A1* | 11/2015 | Cheng ................ H01L 29/0847 257/192 |
| 2016/0020209 A1* | 1/2016 | Anderson ............ H01L 21/845 257/383 |
| 2016/0111524 A1* | 4/2016 | Ha .................... H01L 29/66795 438/283 |

FOREIGN PATENT DOCUMENTS

| | | |
|---|---|---|
| KR | 10-0925310 | 11/2009 |
| KR | 10-1060372 | 8/2011 |
| KR | 1020110095456 | 8/2011 |
| KR | 1020120001640 | 1/2012 |
| KR | 1020120018064 | 2/2012 |
| KR | 1020120106365 | 9/2012 |
| KR | 1020120107762 | 10/2012 |
| KR | 1020140108960 | 9/2014 |

* cited by examiner

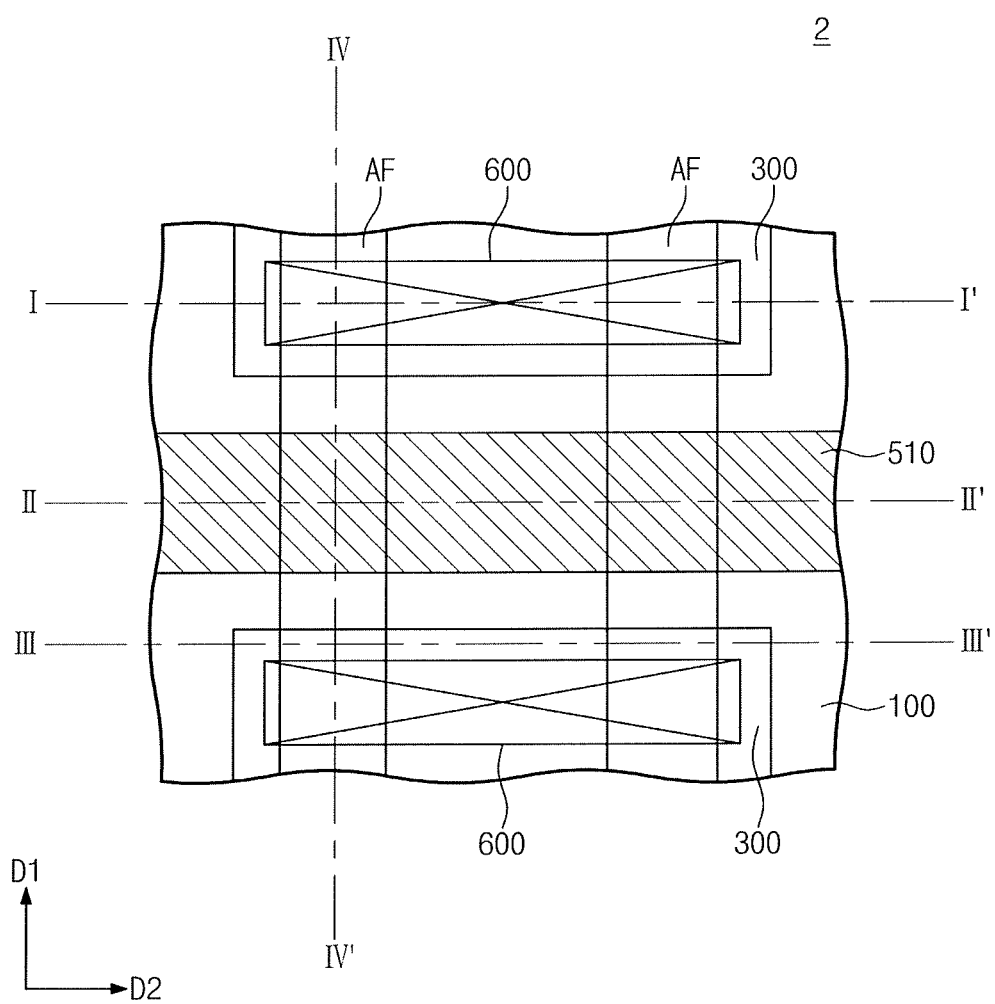

2000

3000

SEMICONDUCTOR DEVICES AND METHODS OF FABRICATING THE SAME

CROSS-REFERENCE TO RELATED APPLICATION

This application claims priority under 35 U.S.C. §119 to Korean Patent Application No. 10-2015-0050557, filed on Apr. 10, 2015, in the Korean Intellectual Property Office, the disclosure of which is incorporated by reference herein in its entirety.

TECHNICAL FIELD

The present inventive concept relates to a semiconductor device and a method of fabricating the same.

DISCUSSION OF RELATED ART

A semiconductor device may include an integrated circuit (IC) composed of a plurality of metal oxide semiconductor field effect transistors (MOSFETs). To reduce the size of a semiconductor device, MOS transistors scale down.

SUMMARY

Example embodiments of the inventive concept provide a semiconductor device with improved reliability and a method of fabricating the same.

Other example embodiments of the inventive concept provide a semiconductor device with improved resistance property and a method of fabricating the same.

According to example embodiments of the inventive concept, a method of fabricating a semiconductor device may include forming a source/drain pattern on a substrate, the source/drain pattern containing a plurality of silicon atoms and a plurality of germanium atoms and forming a capping pattern on the source/drain pattern. The forming of the capping pattern may comprise removing at least one germanium atom from the plurality of germanium atoms of the source/drain pattern.

In example embodiments, wherein the forming a capping pattern may comprise supplying a hydrogen gas onto the source/drain pattern to remove at least one germanium atom from the plurality of germanium atoms of the source/drain pattern.

In example embodiments, wherein the removing at least one germanium atom from the plurality of germanium atoms of the source/drain pattern may comprise generating a reaction gas including at least one of hydrogen radical, hydrogen anion, and/or hydrogen cation from a hydrogen gas and wherein the reaction gas may reacted with the at least one germanium atom so that the at least one germanium atom may removed from the source/drain pattern.

In example embodiments, wherein the reaction gas may react with the at least one germanium atom at a temperature lower than a temperature at which the source/drain pattern is formed.

In example embodiments, the forming a source/drain pattern may be performed by an epitaxial growth process.

In example embodiments, the source/drain pattern may comprise a first portion including a first surface having a crystal plane of {111}, and a second portion including a second surface which is different from the first surface having the crystal plane {111}.

In example embodiments, wherein the at least one germanium atom is uniformly removed along the first and the second surfaces of the source/drain pattern.

In example embodiments, the source/drain pattern may further include group-V dopants.

In example embodiments, the method may further include forming an interlayered insulating layer on the capping pattern, forming a contact hole to penetrate the interlayered insulating layer and expose the source/drain pattern, and forming a contact plug in the contact hole.

According to example embodiments of the inventive concept, a method of fabricating a semiconductor device may include providing a substrate with an active patterns, forming a forming a sacrificial gate pattern on the active pattern, removing a portion of the active pattern adjacent to the gate pattern to form a recessed active pattern, forming a source/drain pattern on the recessed active pattern, wherein the source/drain pattern includes a plurality of germanium atoms and forming a capping pattern in the source/drain pattern by removing part of the germanium atoms from the source/drain pattern.

In example embodiments, the forming a capping pattern may include supplying reaction gas onto the source/drain pattern, and removing germanium atoms from a surface of the source/drain pattern. The reaction gas may be reacted with the germanium atoms in the surface of the source/drain pattern.

In example embodiments, the forming a capping pattern may include supplying reaction gas onto the source/drain pattern. The reaction gas may be reacted with the germanium atoms in the surface of the source/drain pattern.

In example embodiments, the forming of the capping pattern may comprise performing a hydrogen plasma treatment process on the source/drain pattern at a lower temperature than a temperature at which the source/drain pattern is formed.

In example embodiments, the source/drain pattern may further comprise a plurality of silicon atoms.

In example embodiments, the method may further forming an interlayered insulating layer on the device isolation pattern to cover the capping pattern at both sides of the sacrificial gate pattern, removing the sacrificial gate pattern to form an opening exposing the active pattern, forming a gate pattern in the opening, forming a contact hole in the interlayered insulating layer to expose the source/drain pattern and filling the contact hole with a conductive material to form a contact plug electrically connected to the source/drain pattern.

In example embodiments, the method may further comprise forming a device isolation pattern on the substrate to cover lower sidewalls of the active patterns, wherein the source/drain pattern comprises, first portion provided on the recess region of the active pattern and a second portion provided on the device isolation pattern and to have a crystal plane different from the first portion, the capping pattern formed on the second portion has substantially a same thickness as the capping pattern formed on the first portion.

According to example embodiments of the inventive concept, a semiconductor device may include active patterns disposed on a substrate, wherein each of the active patterns, extending in a first direction, has a first region and a recessed region, a device isolation pattern provided on the substrate to cover lower sidewalls of the active patterns, a gate pattern disposed on the first region of the active pattern, wherein the gate pattern extends in a second direction different from the first direction, a source/drain pattern disposed on the recessed regions of the active patterns and a capping pattern covering the source/drain pattern, wherein the capping pattern has a substantially uniform thickness, wherein the source/drain pattern comprises, first portions provided on the recess regions of the active patterns and a second portion provided on the device isolation pattern and interposed between the first portions.

In example embodiments, the capping pattern may comprise a first portion, a second portion connected to the first portion and a third portion connected to the first and second portions, wherein the first, second and third portions may have substantially the same thickness.

In example embodiments, the first portions of source/drain pattern may contact the first and second portions of the capping pattern and has a {111} crystal plane, and the second portion of the source/drain pattern may contact third portion of the capping pattern has a {100} crystal plane and a {110} crystal plane.

In example embodiments, the source/drain pattern and the capping pattern may comprise a plurality of germanium atoms, and wherein the capping pattern has less germanium atoms than the source/drain pattern.

In example embodiments, a semiconductor device may comprise an active pattern disposed on a substrate and extended in a first direction, a gate pattern disposed on a first region of the active pattern and extended in a second direction different from the first direction, a source/drain pattern disposed on a second region of the active pattern, wherein the second region of the active pattern is adjacent to the gate pattern and the source/drain pattern has a first concentration of germanium atoms, a first capping pattern covering the source/drain pattern, wherein the first capping pattern has a second concentration of germanium atoms smaller than the first concentration and the capping pattern has a substantially uniform thickness and a contact plug penetrating the first capping pattern to be in contact with the source/drain pattern.

In example embodiments, a difference between the second concentration and the first concentration may about 3 atomic percent or more.

In example embodiments, the second region of the active pattern is recessed, and the source/drain pattern is disposed on the recessed second region.

According to example embodiments of the inventive concept, a method of fabricating a semiconductor device may include forming an active pattern disposed on a substrate and extended in a first direction, forming a gate pattern disposed on a first region of the active pattern and extended in a second direction different from the first direction, forming a source/drain pattern disposed on a second region of the active pattern, wherein the second region of the active pattern is adjacent to the gate pattern and the source/drain pattern has a first concentration of germanium atoms, forming a first capping pattern covering the source/drain pattern, wherein the first capping pattern has germanium atoms smaller than the first concentration, and the capping pattern has a substantially uniform thickness and forming a contact plug penetrating the first capping pattern to be in contact with the source/drain pattern.

In example embodiments, a difference between the second concentration and the first concentration may about 3 atomic percent or more.

In example embodiments, the second region of the active pattern may be recessed, and the source/drain pattern is disposed on the recessed second region.

BRIEF DESCRIPTION OF THE DRAWINGS

These and other features of the inventive concept will become more apparent by describing in detail example embodiments thereof with reference to the accompanying drawings of which:

FIG. 3 is a plan view illustrating a semiconductor device example embodiment of the present inventive concept.

Figure 1:
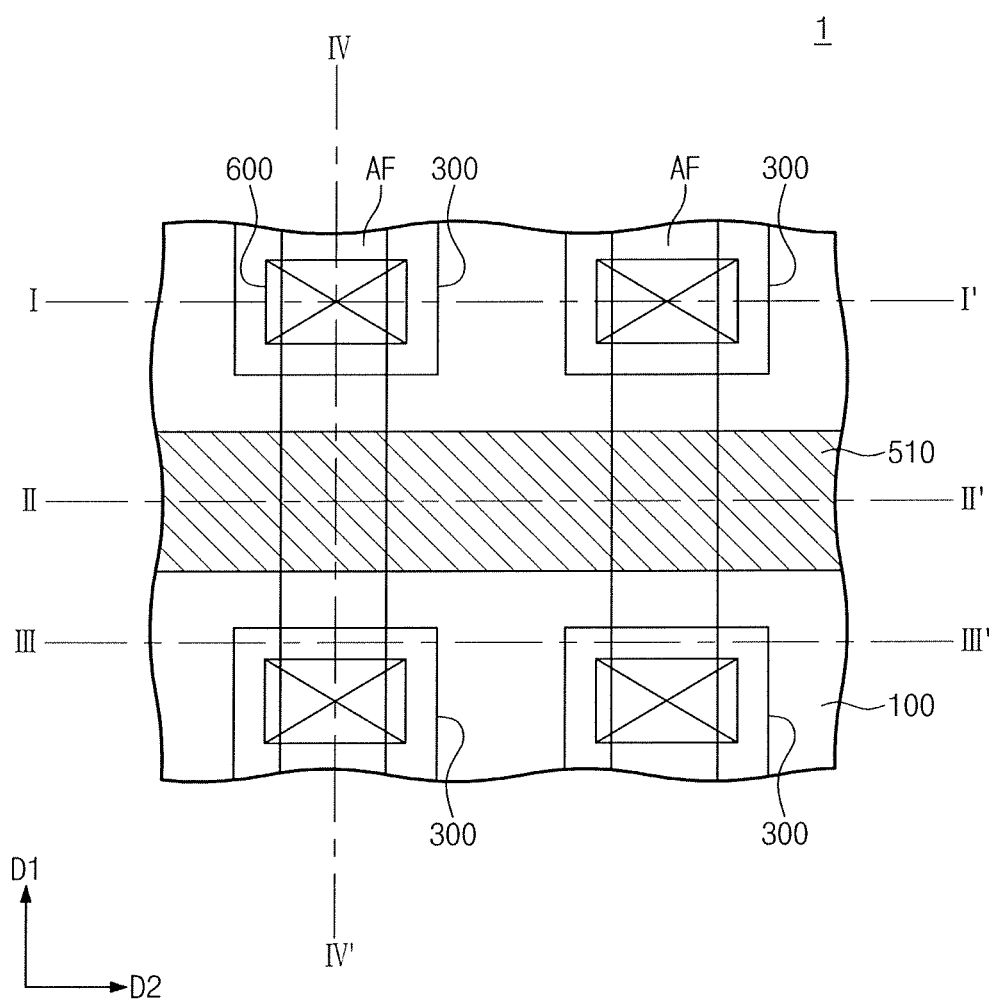
FIG. 1 is a plan view illustrating a semiconductor device according to an example embodiment of the present inventive concept.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXAMPLE EMBODIMENTS

Example embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a plan view illustrating a semiconductor device 1 according to an example embodiment of the present inventive concept. FIGS. 2A through 2F are sectional views exemplarily illustrating a method of fabricating a semiconductor device, according to an example embodiment of the present inventive concept. For example, each of FIGS. 2A through 2F illustrates vertical sections taken along lines I-I', II-II', III-III', and IV-IV' of FIG. 1.

Figure 2A:
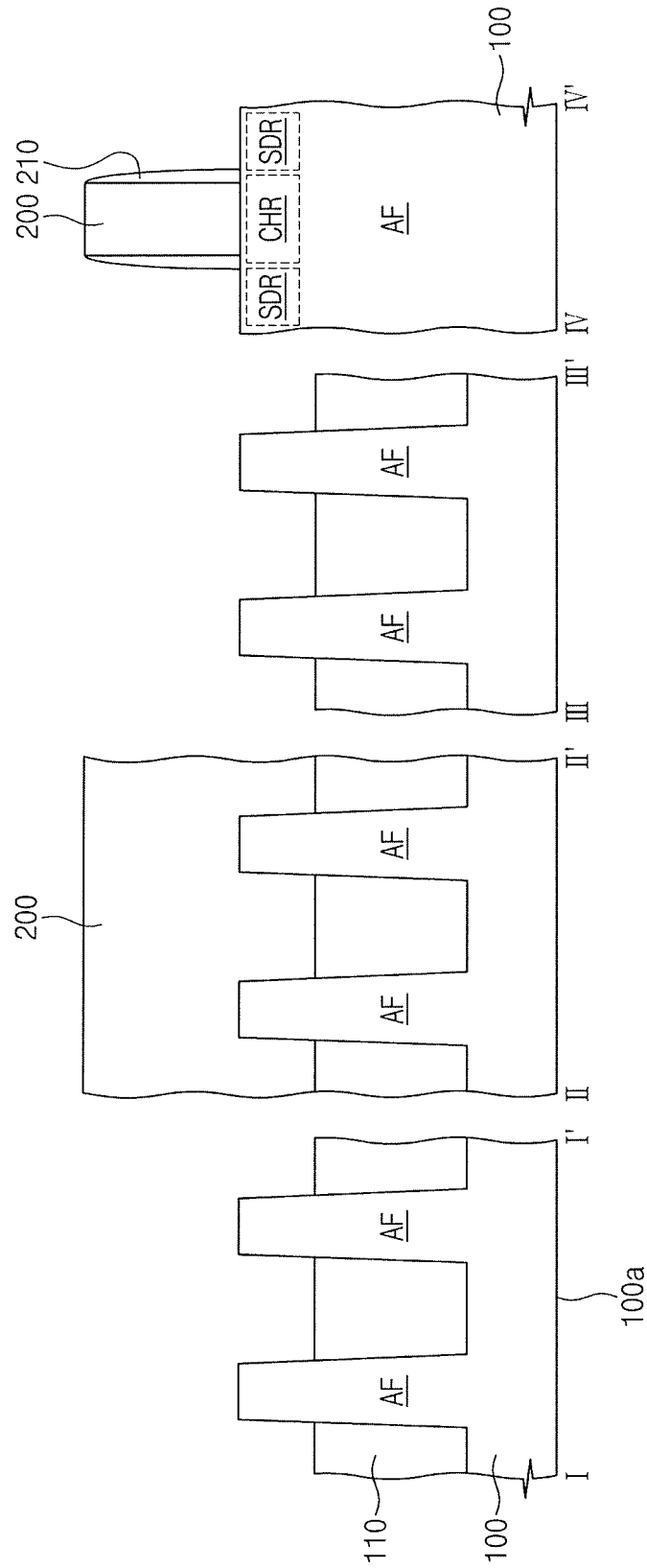
FIGS. 2A through 2F are sectional views illustrating a method of fabricating a semiconductor device, according to an example embodiment of the present inventive concept.

Referring to FIGS. 1 and 2A, a substrate 100 may be patterned to form at least one active pattern AF. The active pattern AF may extend in a first direction D1. Here, the first direction D1 may be parallel to a bottom surface 100a of the substrate 100. The substrate 100 may be a semiconductor substrate (e.g., a silicon wafer, a germanium wafer, a silicon-germanium wafer, or an epitaxial substrate). The formation of the active pattern AF may include forming a mask layer (not shown) on the substrate 100 and etching the substrate 100 using the mask layer as an etch mask. The active pattern AF may include source/drain regions SDR and a channel region CHR. The channel region CHR may be interposed between the source/drain regions SDR. A source/drain of a transistor will be formed in the source/drain regions SDR, and a channel of the transistor will be formed in the channel region CHR using subsequent processes.

A device isolation pattern 110 may be formed on the substrate 100 to cover at least a portion of both sidewalls of the active pattern AF. The device isolation pattern 110 may be formed to expose an upper portion of the active pattern AF. The device isolation pattern 110 may be formed using a shallow trench isolation (STI) method. The device isolation pattern 110 may be formed of or include a high density plasma oxide layer, a spin on glass (SOG) layer, and/or a chemical vapor deposition (CVD) oxide layer.

A sacrificial gate pattern 200 may be formed on the substrate 100. The sacrificial gate pattern 200 may cross the active pattern AF and extend along a second direction D2. Here, the second direction D2 may be parallel to the bottom surface of the substrate 100 and cross the first direction D1. The sacrificial gate pattern 200 may be formed to cover the channel region CHR of the active pattern AF and expose the source/drain regions SDR. The sacrificial gate pattern 200 may be formed of or include polysilicon.

Spacer patterns 210 may be formed on the substrate 100 to cover both sidewalls of the sacrificial gate pattern 200. The spacer patterns 210 may include a plurality of stacked layers. The formation of the spacer patterns 210 may include forming a spacer layer (not shown) on the substrate 100 to conformally cover the sacrificial gate pattern 200 and performing an etching process to etch at least a portion of the spacer layer. The spacer patterns 210 may be formed of or include an insulating material (e.g., silicon nitride, silicon carbide, silicon carbonitride, and silicon oxynitride). In an example embodiment, the spacer patterns 210 may be formed of or include at least one of low-k dielectric materials.

Figure 2B:
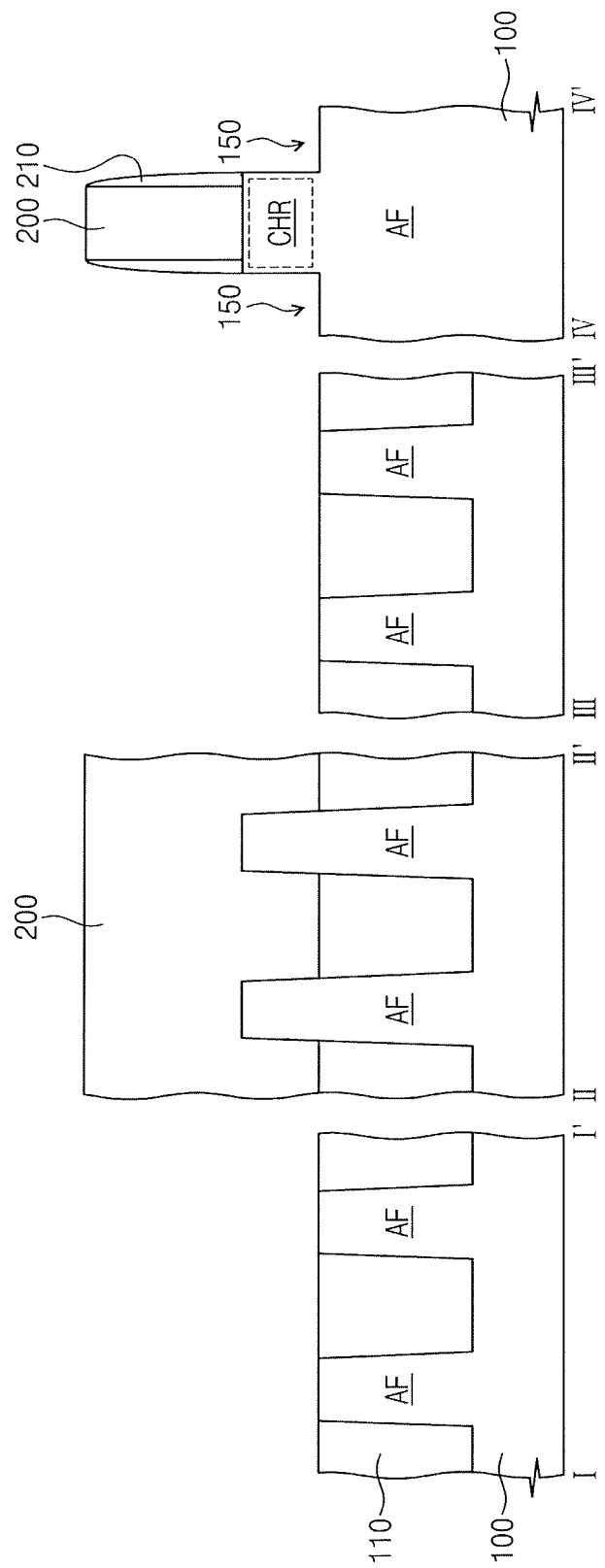

Referring to FIGS. 1 and 2B, an etching process may be performed to etch the source/drain regions SDR exposed by the sacrificial gate pattern 200 and form recessed regions 150 in the active pattern AF. The recessed region 150 may be formed to have a bottom surface, which is positioned at a lower level than the top surface of the active pattern AF. Each of the recessed regions 150 may be formed at a side of the sacrificial gate pattern 200.

Figure 2C:
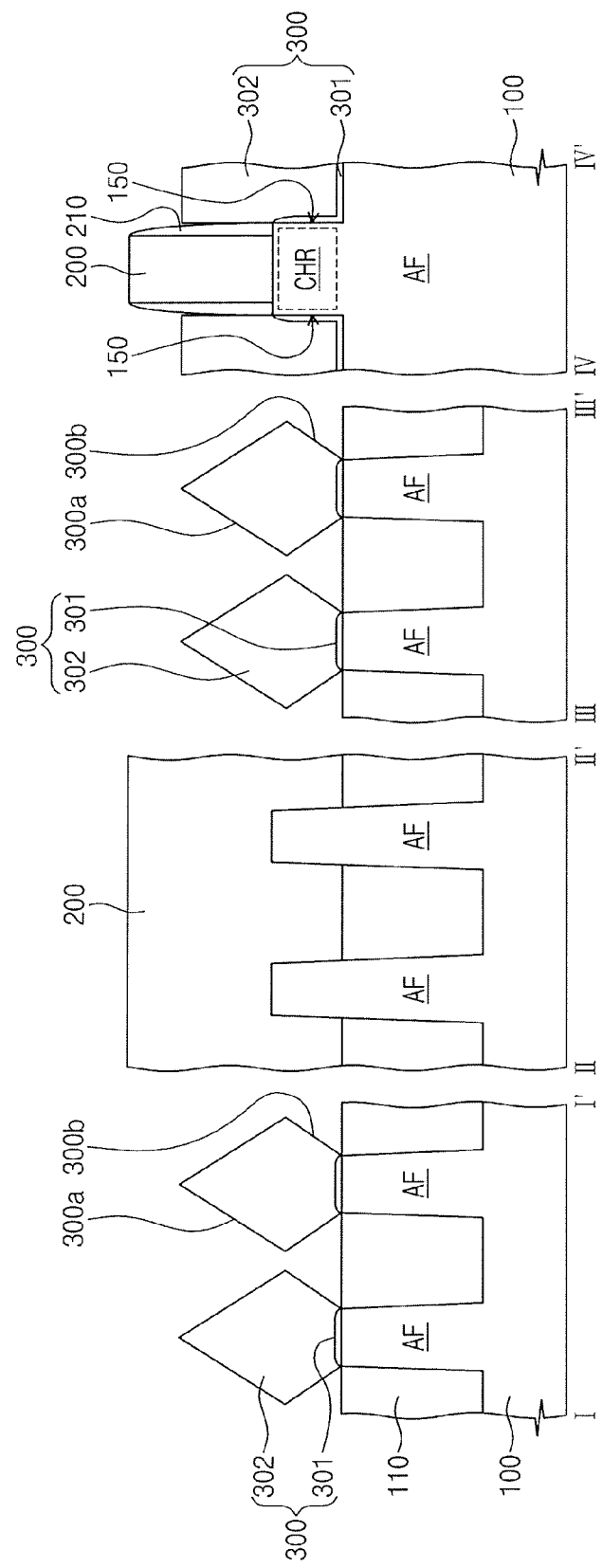

Referring to FIGS. 1 and 2C, a source/drain pattern 300 may be formed on the active pattern AF adjacent to the sacrificial gate pattern 200. The source/drain pattern 300 may be formed of or include silicon-germanium (SiGe). The source/drain pattern 300 may be formed by an epitaxial growth process using the recessed region 150 of the active pattern AF as a seed layer. For example, the epitaxial growth process for the source/drain pattern 300 may include loading the substrate 100 in a first chamber and supplying a silicon-containing gas and a germanium-containing gas into the first chamber. The epitaxial growth process for the source/drain pattern 300 may be performed at a temperature ranging from about 400° C. to about 700° C. (for example, at about 550° C.).

The source/drain pattern 300 may be formed to have a germanium content of about 5 atomic percent or higher. The source/drain pattern 300 may include a first layer 301 and a second layer 302 on the first layer 301. The substrate 100 may be a silicon wafer. The first layer 301 may be formed to have a germanium content lower than that of the second layer 302. For example, the first layer 301 may be formed to have a germanium content of 30 atomic percent or lower, and the second layer 302 may be formed to have a germanium content of 30 atomic percent or higher. The first layer 301 may be interposed between the substrate 100 and the second layer 302 to relieve a mechanical stress, which is caused by a difference in lattice constant between the substrate 100 and the second layer 302.

The source/drain pattern 300 may have upper and lower inclined surfaces 300a and 300b. The upper and lower inclined surfaces 300a and 300b may be the crystal plane of {111}. For example, the upper and lower inclined surfaces 300a and 300b may be reciprocally inclined with respect to the bottom surface of the substrate 100 to meet each other. The source/drain pattern 300 may be formed to contain p-type dopants (e.g., B and/or Al).

Figure 2D:
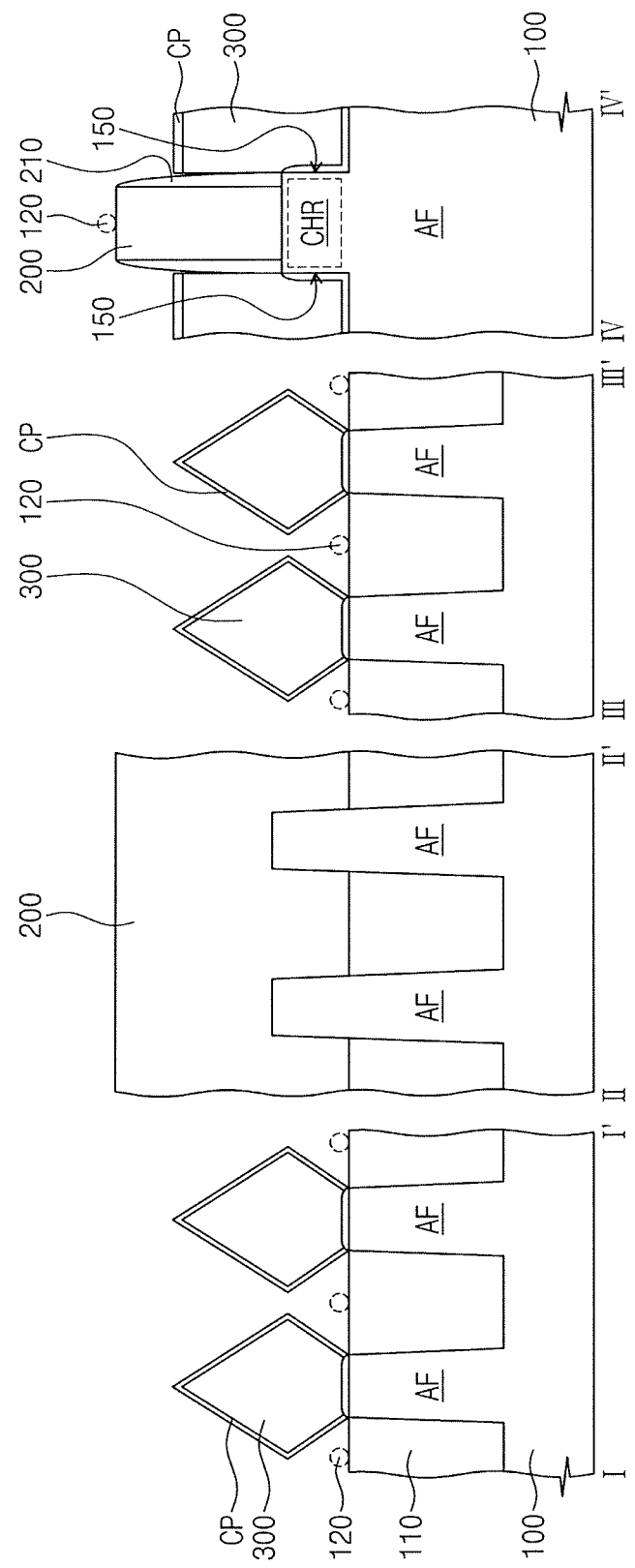

Referring to FIGS. 1 and 2D, germanium may be removed from an exposed surface of the source/drain pattern 300 to form a capping pattern CP in the source/drain pattern 300. The capping pattern CP may be formed to have substantially uniform thickness in the source/drain pattern 300. For example, a surface region of the source/drain may has less concentration due to the removal of germanium from the surface region compared to the other region of the source/drain, and such less-concentration surface region of the source/drain may be referred to as the capping pattern CP. The capping pattern CP may be formed by a different process from that for the source/drain pattern 300 (e.g., the epitaxial growth process). For example, the removal of germanium may include exposing the source/drain pattern 300 with a reaction gas, and in this case, germanium atoms contained in the source/drain pattern 300 may be chemically reacted with the reaction gas to form a product, such as $GeH_4$. Here, the reaction gas may contain at least one of hydrogen gas, hydrogen radical, hydrogen cation, or hydrogen anion. The product produced in the reaction between the germanium and the reaction gas may be removed through sublimation. Accordingly, the capping pattern CP may have a lower germanium content and a higher silicon content, when compared with the source/drain pattern 300. For example, the germanium content of the capping pattern CP may be lower by about 3 atomic percent or higher than that of the source/drain pattern 300.

Hereinafter, the formation of the capping pattern CP will be described in more detail with reference to Table 1, in conjunction with FIGS. 1 and 2D.

TABLE 1

| | First Example | | Second Example | |
|---|---|---|---|---|
| | Formation of S/D pattern 1$^{st}$ chamber | Formation of capping pattern 1$^{st}$ chamber | Formation of S/D pattern 1$^{st}$ chamber | Formation of capping pattern 2$^{nd}$ chamber |
| Supplied Gas | Si-containing gas, Ge-containing gas | Hydrogen gas | Si-containing gas, Ge-containing gas | Hydrogen gas |
| Process Temperature | 1$^{st}$ temperature T1 | 2$^{nd}$ temperature T2, (T2 ≥ T1) | 1$^{st}$ temperature T1 | 3$^{rd}$ temperature T3, (T3 ∠ T1) |

In the first example, the capping pattern CP may be formed by a hydrogen thermal treatment process. For example, the supply of the silicon-containing or germanium-containing gas may be interrupted, and a hydrogen gas may be supplied into the first chamber. The temperature of the first chamber may be controlled in such a way that the substrate 100 has a second temperature (e.g., ranging from about 400° C. to about 700° C.). The second temperature may be substantially equal to or higher than the first temperature. At the second temperature T2, the hydrogen gas may react with germanium atoms of the source/drain pattern 300 so that the germanium atoms may be removed. In an example embodiment, the device isolation pattern 110 and the sacrificial gate pattern 200 may have a surface that is free of germanium, and this may make it possible for the hydrogen gas to be selectively reacted with the source/drain pattern 300. Accordingly, the capping pattern CP may be locally, or selectively formed on the source/drain pattern 300.

In an example embodiment, the capping pattern CP may be formed by a hydrogen plasma treatment process, which is performed at a lower temperature than that for the source/drain pattern 300. For example, the substrate 100 may be provided in a second chamber. The second chamber may be a plasma chamber. The temperature of the second chamber may be controlled in such a way that the substrate 100 has a third temperature lower than the first temperature. For example, the third temperature may range from about 300° C. to about 500° C. (for example, at about 400° C.). The hydrogen gas may be supplied into the second chamber, while the silicon-containing gas and the germanium-containing gas may not be supplied. Accordingly, since the silicon-containing gas and the germanium-containing gas are not supplied in the process of forming the capping pattern CP, the formation of by-products due to the silicon-containing gas and the germanium-containing gas may be prevented from being formed on the device isolation pattern 110 and/or the sacrificial gate pattern 200. Plasma may be generated in the second chamber to produce hydrogen radical, hydrogen anion, and/or hydrogen cation from the hydrogen gas. At a third temperature lower than the first temperature, germanium atoms positioned at the surface region of the source/drain pattern may react with the hydrogen radical, the hydrogen anion, and/or the hydrogen cation. Since the capping pattern CP is formed at the third temperature lower than the first temperature, it may be avoided that the formation of the capping pattern CP affect the reliability of the semiconductor device 1.

Figure 2E:
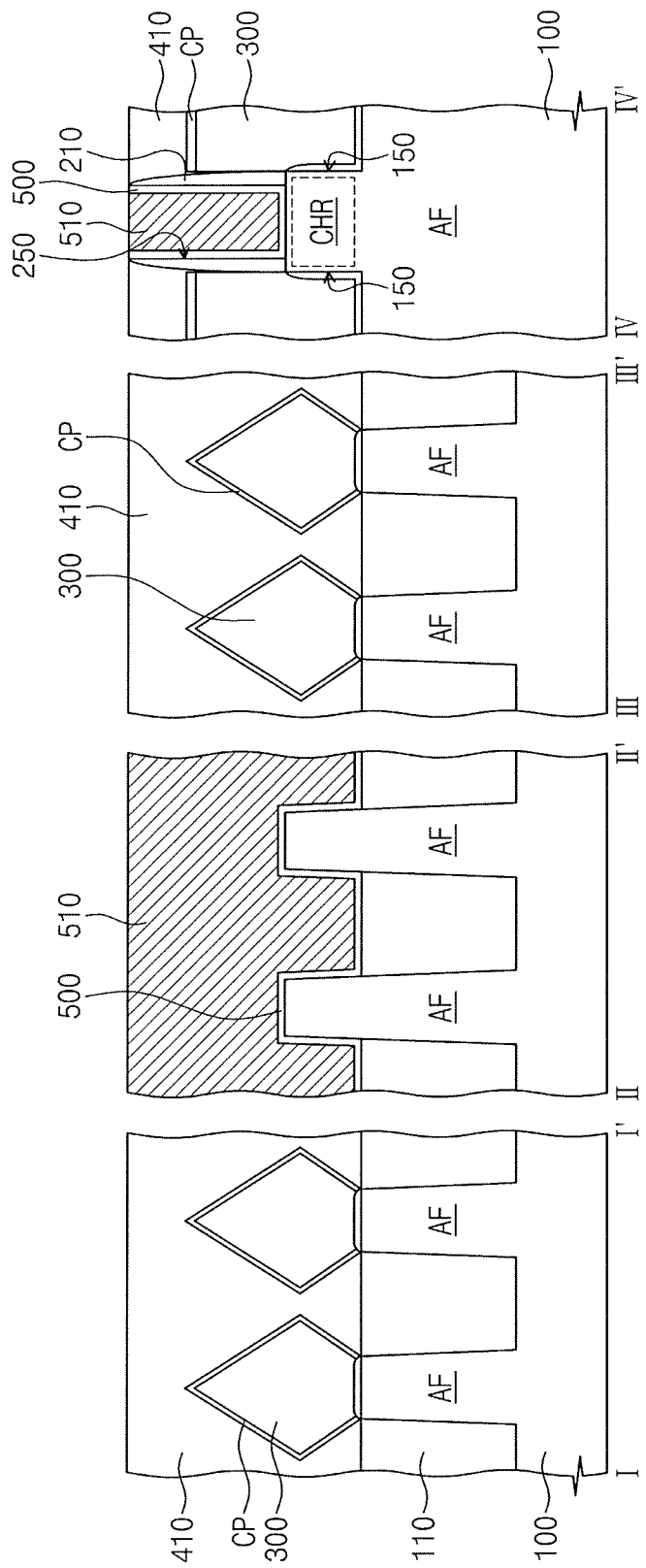

Referring to FIGS. 1 and 2E, a first interlayered insulating layer 410 may be formed on the device isolation pattern 110 and at both sides of a gate pattern 510 to cover the capping pattern CP. The first interlayered insulating layer 410 may be formed of or include at least one of silicon oxide, silicon nitride, silicon oxynitride, or low-k dielectric materials. The gate sacrificial pattern 200 (e.g., of FIG. 2D) may be removed to form an opening 250. The opening 250 may be formed to expose the channel region CHR of the active pattern AF positioned between the spacer patterns 210. A gate insulating pattern 500 may be formed on bottom and side surfaces of the opening 250 to cover the channel region CHR of the active pattern AF. For example, the gate insulating pattern 500 may be formed of or include at least one of silicon oxide, silicon nitride, or silicon oxynitride. In an example embodiment, the gate insulating pattern 500 may be formed of or include at least one of hafnium oxide, hafnium silicate, zirconium oxide, or zirconium silicate.

The gate pattern 510 may be formed on the gate insulating pattern 500 and in the opening 250. The gate pattern 510 may extend in the second direction D2 to cross the active pattern AF. The gate pattern 510 may be formed on the channel region CHR of the active pattern AF. The gate pattern 510 may include a plurality of layers. The gate pattern 510 may be formed of or include at least one of conductive materials including conductive metal nitrides, transition metals (e.g., titanium, tantalum, and so forth), and metals. The formation of the gate pattern 510 may include forming a conductive layer (not shown) to fill the opening 250 and performing a thermal treatment process (e.g., an annealing process) on the conductive layer. The thermal treatment process for forming the gate pattern 510 may lead to agglomeration of germanium atoms contained in the source/drain pattern 300. The agglomeration of germanium atoms may result in an electric short between the source/drain pattern 300 and the gate pattern 510, in operation of the semiconductor device 1. In an example embodiment, since the capping pattern CP is formed to cover the source/drain pattern 300, the germanium atoms contained in the source/drain pattern 300 may be avoided from being agglomerated in the thermal treatment process. As described above, the thermal treatment process may be performed to form the gate pattern 510, but the present inventive concept is not limited thereto. For example, the thermal treatment process may refer to a thermal treatment process, which may be performed after the formation of the capping pattern CP. According to an example embodiment of the present inventive concept, the semiconductor device 1 can be fabricated to have improved reliability.

Figure 2F:
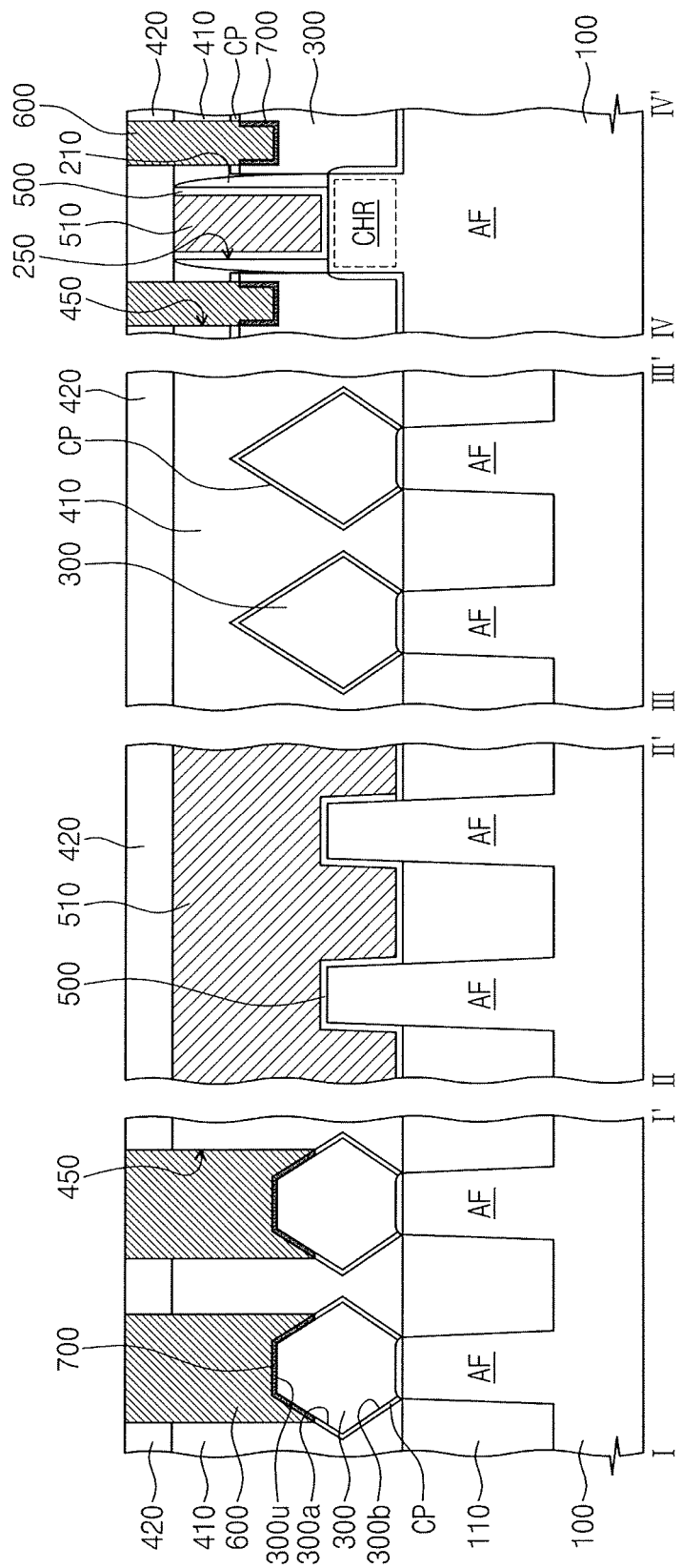
Figure 4A:
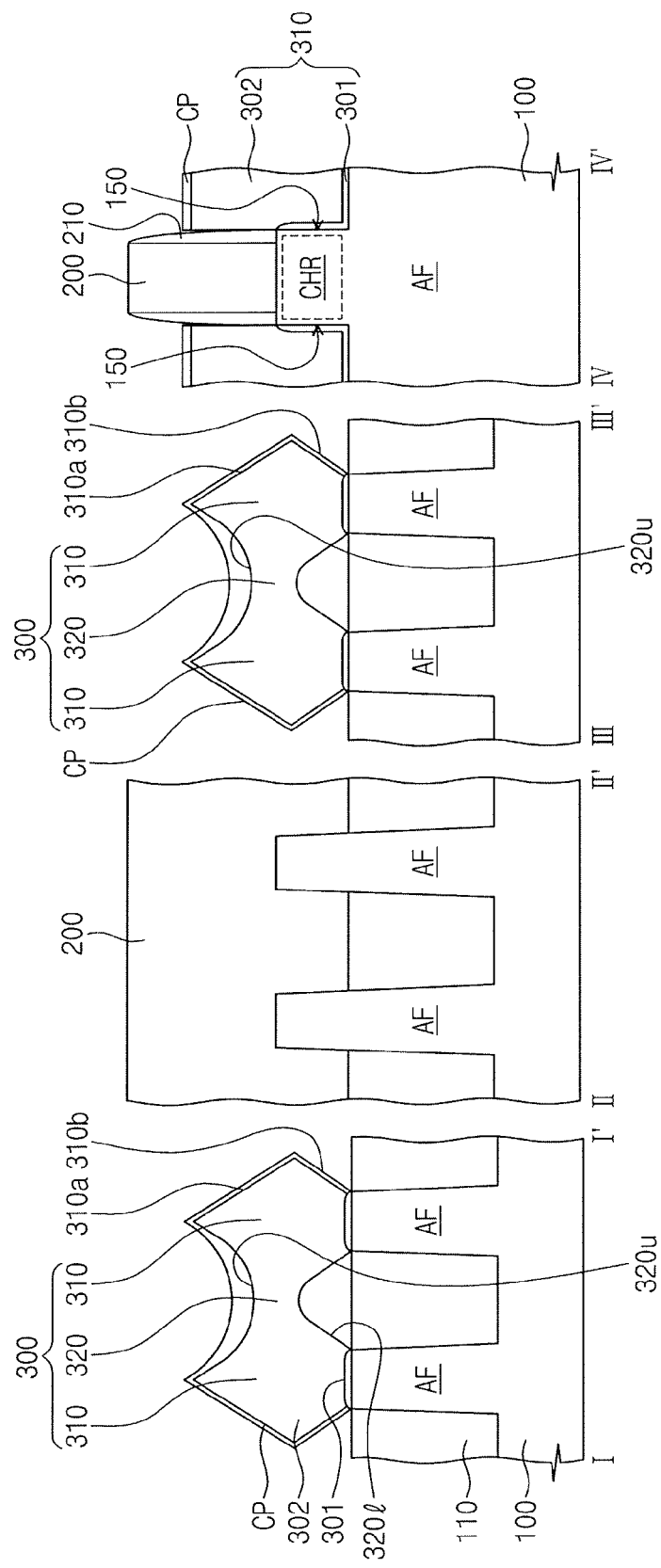
FIGS. 4A and 4B are sectional views illustrating a process of fabricating the semiconductor device of FIG. 3.
Figure 4B:
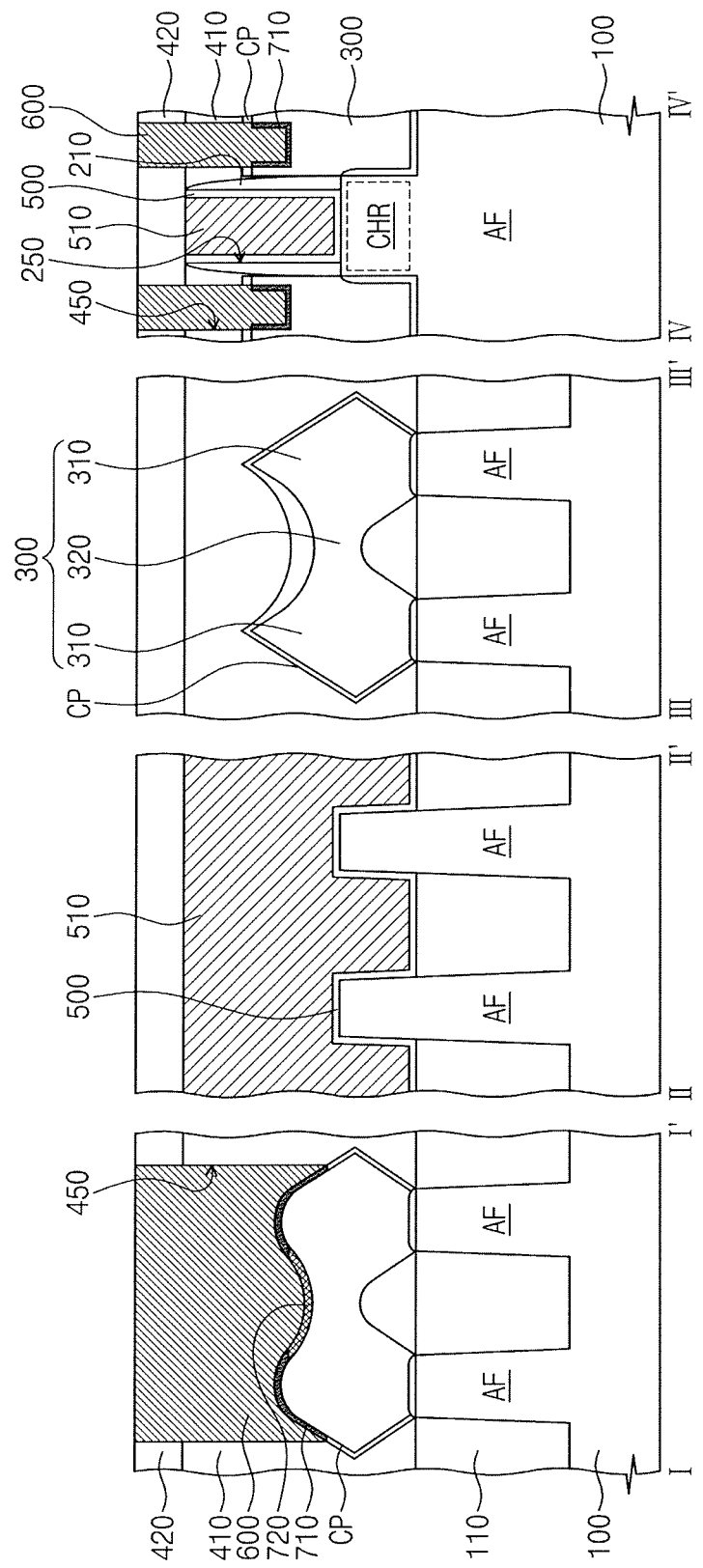

Referring to FIGS. 1 and 2F, a second interlayered insulating layer 420 may be formed on the first interlayered insulating layer 410 to cover the gate pattern 510. The second interlayered insulating layer 420 may include at least one of silicon oxide, silicon nitride, silicon oxynitride, and low-k dielectric materials. A contact hole 450 may be formed to penetrate the first and second interlayered insulating layers 410 and 420 and expose the source/drain pattern 300. For example, the formation of the contact hole 450 may include forming a mask layer (not shown) on the second interlayered insulating layer 420 and etching the first and second interlayered insulating layers 410 and 420 using the mask layer as an etch mask. In an example embodiment, the capping pattern CP exposed by the mask layer (not shown) may be removed by the etching process for forming the contact hole 450. The source/drain pattern 300 exposed by the mask layer may be etched to form an upper surface 300u that is exposed by the contact hole 450. The source/drain pattern 300 may have a different profile from FIG. 2D. For example, the upper surface 300u of the source/drain pattern 300 may be substantially parallel to the bottom surface of the substrate 100. In an example embodiment, the capping pattern CP may be used as an etch stop layer in the etching process for forming the contact hole 450. A contact plug 600 may be formed by forming a conductive material in the contact hole 450. For example, the contact plug 600 may be formed of or include at least one of titanium, tungsten, tantalum, and aluminum. The conductive material may react with the source/drain pattern 300 to form a silicide pattern 700 between the source/drain pattern 300 and the contact plug 600. The contact plug 600 may be electrically connected to the source/drain pattern 300 through the silicide pattern 700. In an example embodiment, the capping pattern CP exposed by the contact hole 450 may be removed to reduce electric resistance between the contact plug 600 and the source/drain pattern 300. FIG. 3 is a plan view illustrating a semiconductor device 2 according to an example embodiment of the inventive concept. FIGS. 4A and 4B are sectional views illustrating a process of fabricating the semiconductor device of FIG. 3, and in detail, each of FIGS. 4A and 4B illustrates vertical sections taken along lines I-I', II-II', III-III', and IV-IV', respectively, of FIG. 3. For concise description, a previously described element may be identified by a similar or identical reference number without repeating an overlapping description thereof.

Referring to FIGS. 3 and 4A, the active patterns AF, the device isolation pattern 110, the sacrificial gate pattern 200, and the spacer patterns 210 may be formed on the substrate 100, similar to that described with reference to FIGS. 2A and 2B. The active patterns AF may be provided to protrude upward from the substrate 100 and extend in the first direction D1. For example, the active patterns AF may have substantially the same structure as that of FIG. 1A. However, the space between the active patterns AF of FIG. 3 may be narrower than that of FIG. 1. The active patterns AF of FIG. 3 may be provided to have a smaller space than that of FIG. 1. The device isolation pattern 110 may cover lower portions of both sidewalls of the active patterns AF. The sacrificial gate pattern 200 may be formed on the channel regions CHR of the active patterns AF. The spacer patterns 210 may be formed at both sides of the sacrificial gate pattern 200. The active patterns AF exposed by the sacrificial gate pattern 200 may be etched to form recessed regions 150 in the active patterns AF.

The source/drain pattern 300 may be formed at a side of the sacrificial gate pattern 200. The source/drain pattern 300 may be formed of or include silicon-germanium (SiGe). The source/drain pattern 300 may be formed by an epitaxial growth process using the recessed regions 150 of the active patterns AF as a seed layer, as described with reference to FIG. 1C. As an example, the formation of the source/drain pattern 300 may include supplying silicon-containing gas and germanium-containing gas at a first temperature ranging from about 400° C. to about 700° C. The source/drain pattern 300 may include p-type dopants (e.g., B and/or Al).

As shown in FIG. 3, when viewed in a plan view, the source/drain pattern 300 may be provided to extend in the second direction D2 and cross the active patterns AF. As shown in FIG. 4A, the source/drain pattern 300 may be provided on the recessed regions 150 of the active patterns AF. The source/drain pattern 300 may include first portions 310 and a second portion 320. The first portions 310 may be provided on the recessed regions 150 of the active patterns AF and may have upper and lower inclined surfaces 310a and 310b. Each of the upper and lower inclined surfaces 310a and 310b of the source/drain pattern 300 may be a crystal plane of {111}. Each of the first portions 310 may include the first layer 301 and the second layer 302. The first layer 301 may have a germanium content lower than that of the second layer 302, and this may make it possible to relieve a mechanical stress, which is caused by a difference in lattice constant between the substrate 100 and the second layer 302. The recessed regions 150 of the active patterns AF may be formed to have a relatively small space, and thus, the first portions 310 on the active patterns AF adjacent to each other may meet each other in the epitaxial growth process of the source/drain pattern 300. Accordingly, the second portion 320 may be formed on the device isolation pattern 110 and between the first portions 310. The second portion 320 may be connected to the first portions 310. An upper surface 320u of the second portion 320 may have a crystal plane (e.g., crystal planes of {100} and {110}) different from the inclined surfaces 310a and 310b of the first portions 310.

The capping pattern CP may be formed on the source/drain pattern 300 by an epitaxial growth process. For example, the capping pattern CP may be formed on the source/drain pattern 300 by supplying silicon-containing gas into the first chamber. The capping pattern CP may have a silicon content higher than that of the source/drain pattern 300.

The capping pattern CP may have a growth rate depending on a crystal orientation. For example, the capping pattern CP may have a slow growth speed in a crystal orientation of <111> and thus it may have a relatively thin thickness on the inclined surfaces 310a and 310b of the first portions 310. In other words, the growth rate of the capping pattern CP may be higher on crystal orientations of <100> or <110> than on the crystal orientation of <111>. Accordingly, the capping pattern CP may be thicker on the upper surface 320u of the second portion 320 than on the first portions 310. Furthermore, the second portion 320 may have surfaces with various crystal directions, and thus, the capping pattern CP on the second portion 320 may not be uniform. The capping pattern CP may not be formed on a lower surface 320l of the second portion 320. In other example embodiments, the capping pattern CP on the lower surface 320l of the second portion 320 may be thinner than the capping pattern CP on the upper surface 320u of the second portion 320.

Referring to FIGS. 3 and 4B, the first interlayered insulating layer 410 may be formed on the device isolation pattern 110 at both sides of the sacrificial gate pattern 200 to cover the capping pattern CP. The sacrificial gate pattern 200 may be removed to form the opening 250, and then, the gate insulating pattern 500 and the gate pattern 510 may be formed in the opening 250. The gate pattern 510 may extend along the second direction D2.

Referring to FIG. 4B in conjunction with FIG. 4A, the second interlayered insulating layer 420 may be formed on the first interlayered insulating layer 410 to cover the gate pattern 510. The first and second interlayered insulating layers 410 and 420, the capping pattern CP, and the source/drain pattern 300 may be etched to form the contact hole 450 penetrating the first and second interlayered insulating layers 410 and 420. Here, the capping pattern CP may be removed on the first portions 310 exposed by a mask layer (not shown), but the capping pattern CP on the second portion 320 may not be removed because it has a relatively large thickness. The contact hole 450 may be formed to expose the first portions 310 of the source/drain pattern 300 and the remaining portion of the capping pattern CP. The contact hole 450 may be filled with a conductive material to form the contact plug 600 in the contact hole 450. The source/drain pattern 300 exposed by the contact hole 450 may be reacted with the conductive material to form a first silicide pattern 710 between the source/drain pattern 300 and the contact plug 600. The capping pattern CP exposed by the contact hole 450 may be reacted with the conductive material to form a second silicide pattern 720. The second silicide pattern 720 may have a germanium content different from that of the first silicide pattern 710. For example, the second silicide pattern 720 may have a silicon content higher than that of the first silicide pattern 710. Although not illustrated, the first silicide pattern 710 may be extended to have a portion located below the second silicide pattern 720. In other example embodiments, as described with reference to FIG. 4A, the capping pattern CP on the second portion 320 may have a relatively large thickness. In this case, a portion of the capping pattern CP may be interposed between the source/drain pattern 300 and the second silicide pattern 720.

Figure 5:
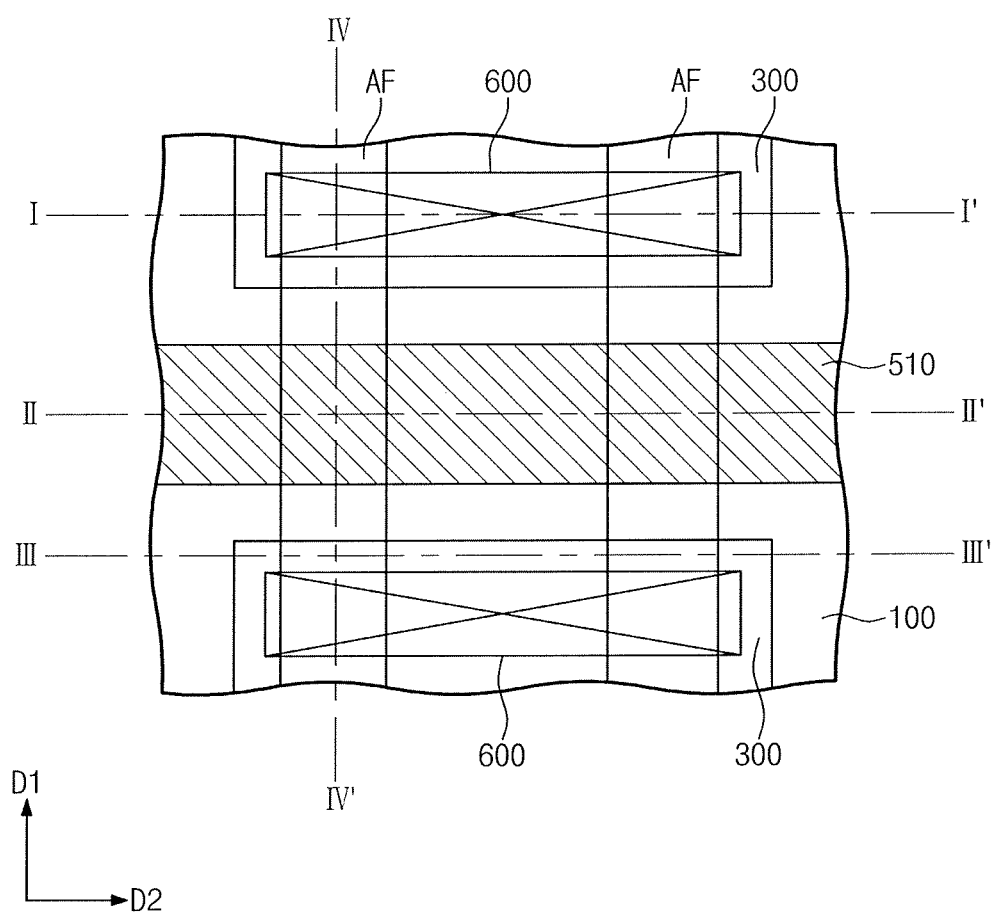
FIG. 5 is a plan view illustrating a semiconductor device according to an example embodiment of the present inventive concept.
Figure 6A:
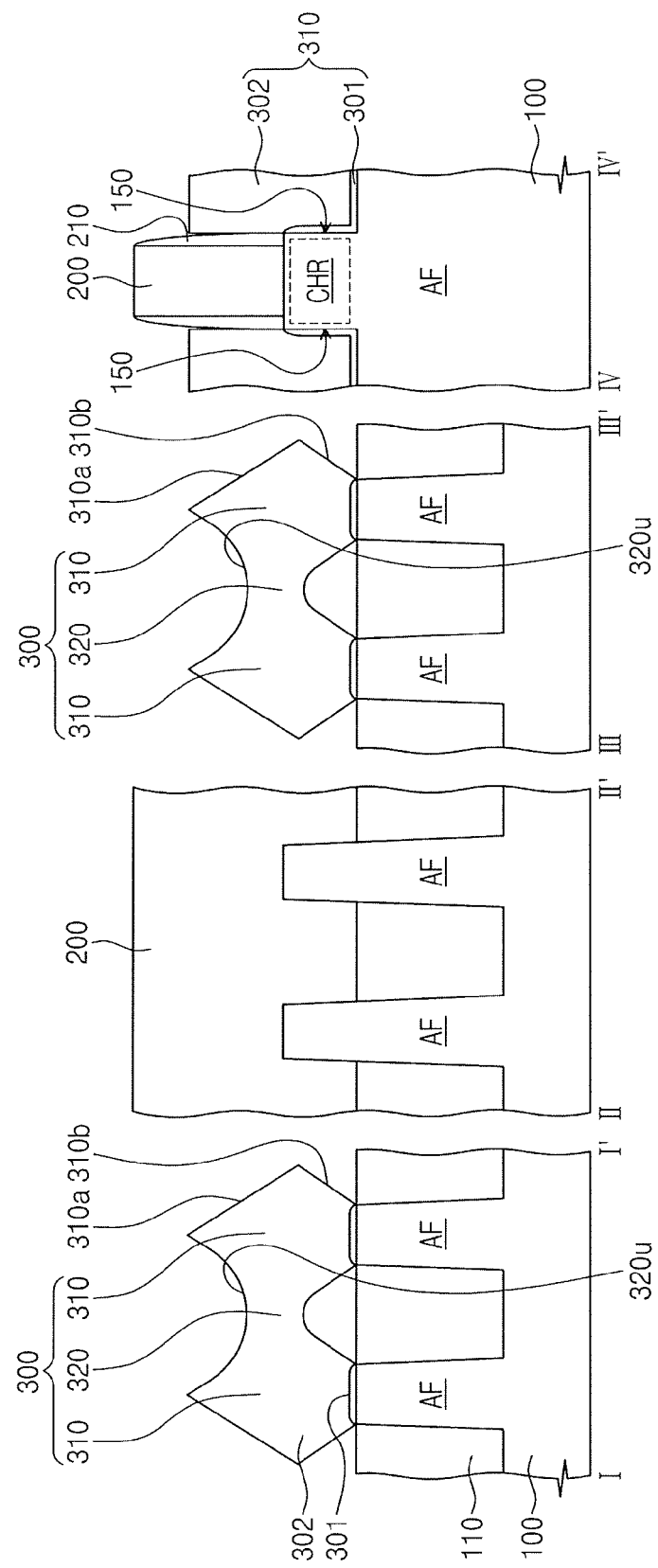
FIGS. 6A through 6C are sectional views illustrating a process of fabricating a semiconductor device of FIG. 5.
Figure 6B:
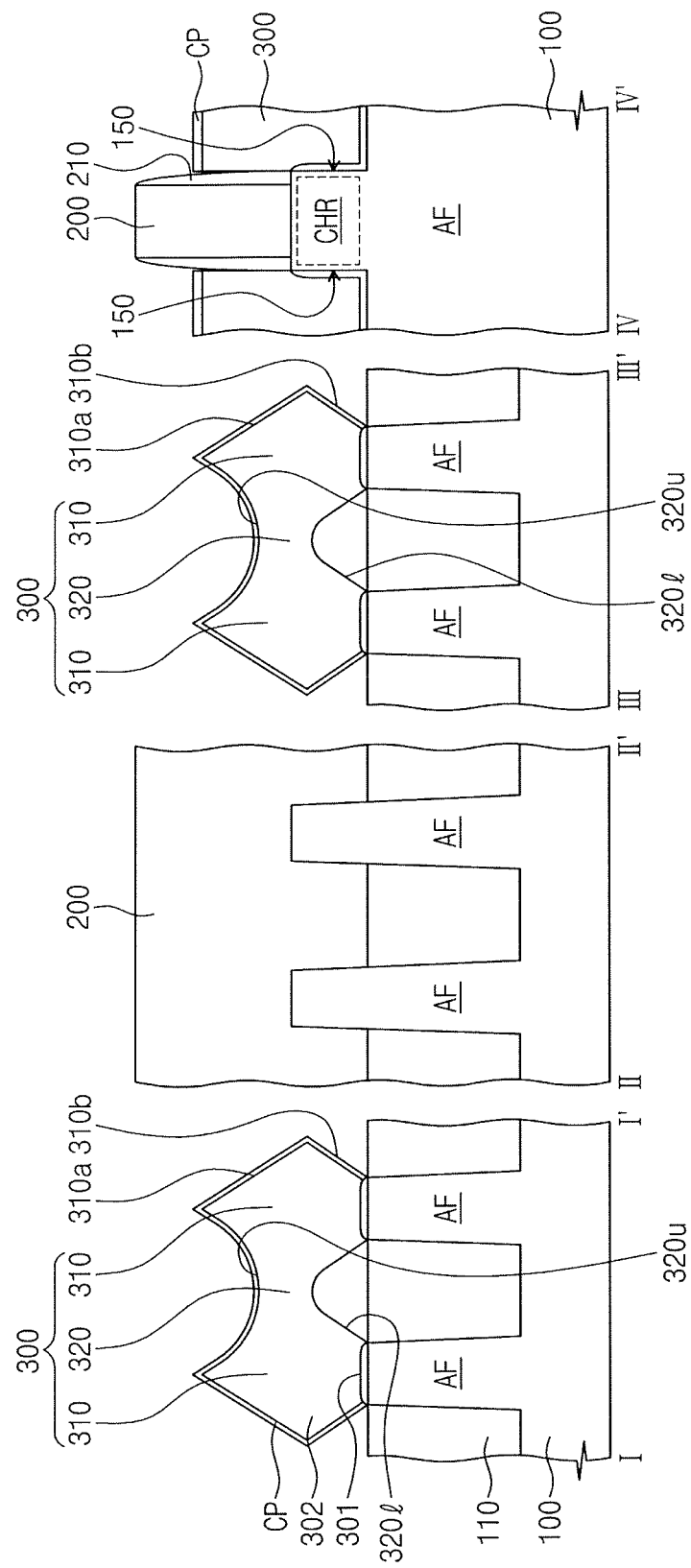
Figure 6C:
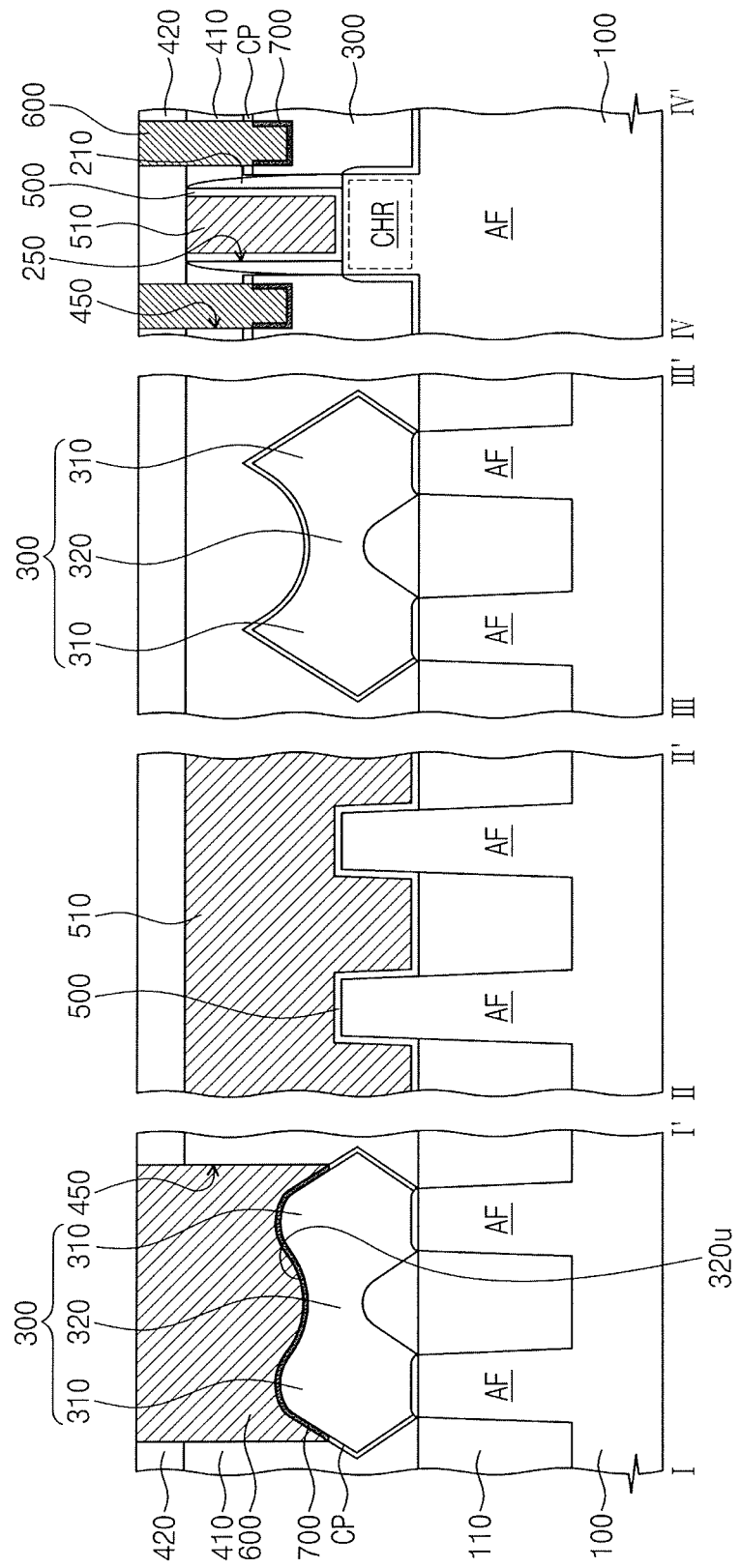

FIG. 5 is a plan view illustrating a semiconductor device 3 according to an example embodiment of the inventive concept. FIGS. 6A through 6C are sectional views illustrating a process of fabricating a semiconductor device of FIG. 5, taken along lines I-I', II-II', III-III', and IV-IV' of FIG. 5. For concise description, a previously described element may be identified by a similar or identical reference number without repeating an overlapping description thereof.

Referring to FIGS. 5 and 6A, an active patterns AF, a device isolation pattern 110, a sacrificial gate pattern 200, and a spacer patterns 210 may be formed on a substrate 100, similar to that described with reference to FIGS. 2A and 2B. The active patterns AF may be formed to protrude upward from the substrate 100 and extend in the first direction D1. The active patterns AF may be formed to be spaced apart from each other at a predetermined distance. The smaller the predetermined distance, more transistors are formed. The device isolation pattern 110 may be formed on the substrate 100 to cover lower portions of both sidewalls of the active patterns AF and expose upper portions of the sidewalls of the active patterns AF. The sacrificial gate pattern 200 may be formed on the device isolation pattern 110 and the active patterns AF. The spacer patterns 210 may be formed at both sides of the sacrificial gate pattern 200. The active patterns AF exposed by the sacrificial gate pattern 200 may be etched to form the recessed regions 150 in the active patterns AF.

The source/drain pattern 300 may be formed at a side of the sacrificial gate pattern 200. The source/drain pattern 300 may be formed of or include silicon-germanium (SiGe). The source/drain pattern 300 may be formed by an epitaxial growth process using the recessed regions 150 of the active patterns AF as a seed layer, as described with reference to FIG. 2C. For example, the formation of the source/drain pattern 300 may include supplying silicon-containing gas and germanium-containing gas at a first temperature ranging from about 400° C. to about 700° C. The source/drain pattern 300 may be formed to contain p-type dopants (e.g., B and/or Al). The source/drain pattern 300 may be formed to cross a plurality of the active patterns AF and extend in the first direction D1. The source/drain pattern 300 may be formed on the recessed regions 150 of the active patterns AF.

The source/drain pattern 300 may include a first portion 310 and a second portion 320. For example, the first portion 310 may include the inclined surfaces 310a and 310b that are a crystal plane of {111}. The first portions 310 may meet each other to form the second portion 320 between the first portions 310. The upper surface 320u of the second portion 320 may have a crystal plane (e.g., of {100} and {110}) that is different from that of the first portions 310.

Referring to FIGS. 5 and 6B, germanium may be removed from an exposed surface of the source/drain pattern 300 to form the capping pattern CP in the source/drain pattern 300. The capping pattern CP may be formed by a process different from that for forming the source/drain pattern 300 (e.g., an epitaxial growth process), as described with reference to FIG. 2D. As described with reference to FIG. 2D and the first example of Table 1, the capping pattern CP may be formed by a hydrogen thermal treatment process, which may be performed at temperature higher than or substantially equal to that of the process for forming the source/drain pattern 300. Alternatively, as described with reference to the second example of Table 1, the capping pattern CP may be formed by a hydrogen plasma treatment process, which may be performed at temperature lower than that of the process for forming the source/drain pattern 300. The source/drain pattern 300 may be exposed by a reaction gas. Here, the reaction gas may contain at least one of hydrogen gas, hydrogen radical, hydrogen anion, or hydrogen cation. The reaction gas may be reacted with germanium atoms of the source/drain pattern 300, and thus, germanium atoms may be removed from an exposed surface of the source/drain pattern 300. Accordingly, the germanium content of the capping pattern CP may be lower by 3 atomic percent than that of the source/drain pattern 300. Since the capping pattern CP is formed by removing germanium atoms from the exposed surface of the source/drain pattern 300, it is possible to prevent or reduce by-products (e.g., 120 of FIG. 2D) from being formed in the process for forming the capping pattern CP. Since the removal of the germanium is performed through a chemical reaction with the reaction gas, the germanium may be removed at a uniform rate, independent of a crystal direction of the source/drain pattern 300. The capping pattern CP may be uniformly formed on the first portion 310 and the second portion 320 of the source/drain pattern 300. Accordingly, the capping pattern CP disposed on the upper surface 320u of the second portion 320 may have substantially the same thickness as the capping pattern CP disposed on the inclined surfaces 310a and 310b of the first portions 310. The capping pattern CP need not be formed on the lower surface 320l of the second portion 320. In an example embodiment, the capping pattern CP formed in a region adjacent to the lower surface 320l may be thinner than the capping layer disposed in a region adjacent to the upper surface 320u of the second portion 320.

In example embodiments, the capping pattern CP may be formed in the source/drain pattern 300. Accordingly, germanium atoms contained in the source/drain pattern 300 may be prevented from being agglomerated, and thus, the semiconductor device 3 may have increased reliability.

Referring to FIGS. 5 and 6C, a first interlayered insulating layer 410 may be formed on the device isolation pattern 110 at both sides of a gate pattern 510 to cover the capping pattern CP. The gate sacrificial pattern 210 of FIG. 6B may be removed, and then, a gate insulating pattern 500 and the gate pattern 510 may be formed in an opening 250. The gate pattern 510 may be formed on the channel regions CHR of the active patterns AF. A second interlayered insulating layer 420 may be formed on the first interlayered insulating layer 410. The etching process may be performed to form a contact hole 450 in the first and second interlayered insulating layers 410 and 420. The capping pattern CP may be formed to such a thickness that the capping pattern CP may be removed during the etching process. Accordingly, the upper surface 320u of the second portion 320 of the source/drain pattern 300 may be exposed by the contact hole 450. The first portions 310 and the second portion 320 of the source/drain pattern 300 may be partially etched during the etching process. The contact hole 450 may be filled with a conductive material to form the contact plug 600 in the contact hole 450. The source/drain pattern 300 exposed by the contact hole 450 may be reacted with the conductive material to form a silicide pattern 700 between the source/drain pattern 300 and the contact plug 600. In an example embodiment, the upper surface 320u of the second portion 320 of the source/drain pattern 300 may be exposed by the contact hole 450, and thus, an electric resistance between the source/drain pattern 300 and the contact plug 600 may be decreased.

Figure 7A:
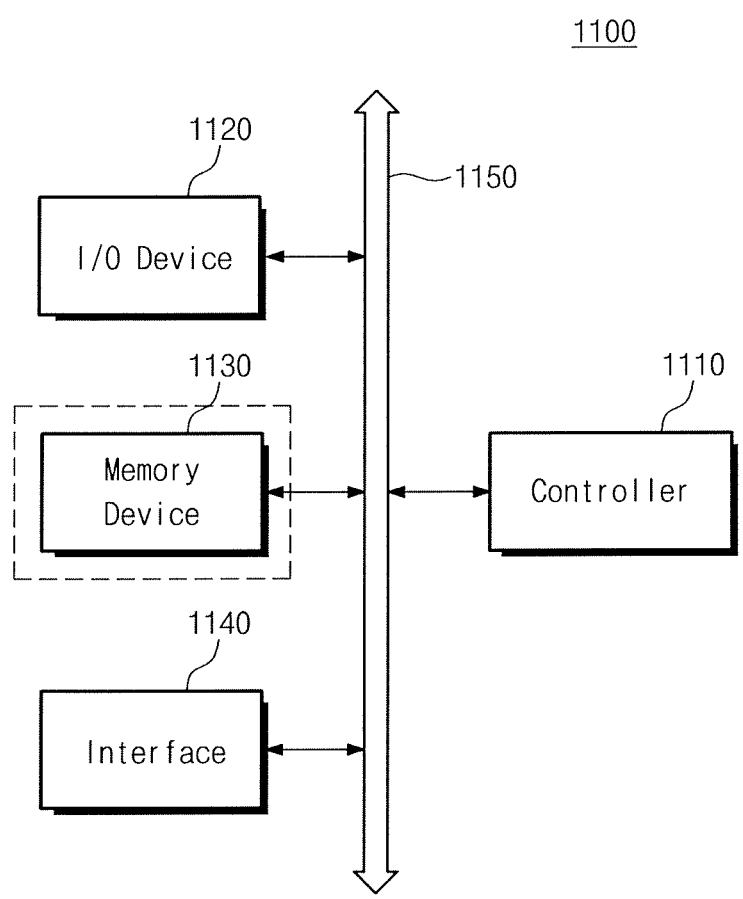
FIG. 7A is a block diagram illustrating an example of an electronic system including a semiconductor device according to an example embodiment of the present inventive concept.

FIG. 7A is a block diagram illustrating an example of an electronic system including a semiconductor device according to an example embodiment of the present inventive concept.

Referring to FIG. 7A, an electronic system 1100 according to an example embodiment of the present inventive concept may include a controller 1110, an input-output (I/O) unit 1120, a memory device 1130, an interface 1140, and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or another logic device, which is configured to have a similar function to them. The I/O unit 1120 may include a keypad, a keyboard, or a display unit. The memory device 1130 may store data and/or commands. The memory device 1130 may include a nonvolatile memory device (e.g., a FLASH memory device, a phase-change memory device, a magnetic memory device, and so forth). Furthermore, the memory device 1130 may further include a volatile memory device. For example, the memory device 1130 may include a static random access memory (SRAM) device with the semiconductor device according to example embodiments of the present inventive concept. It may be possible to omit the memory device 1130, depending on the purpose of the electronic system 1100 or a type of an electronic product, for which the electronic system 1100 is used. The interface unit 1140 may transmit electrical data to a communication network or may receive electrical data from a communication network. The interface unit 1140 may operate in a wireless or wired manner. For example, the interface unit 1140 may include an antenna for the wireless communication or a transceiver for the wired and/or wireless communication. A semiconductor device according to an example embodiment of the present inventive concept may be provided as a part of the controller 1110 or the I/O unit 1120. Although not shown in the drawings, the electronic system 1100 may further include a fast DRAM device and/or a fast SRAM device that acts as a cache memory for improving an operation of the controller 1110.

Figure 7B:
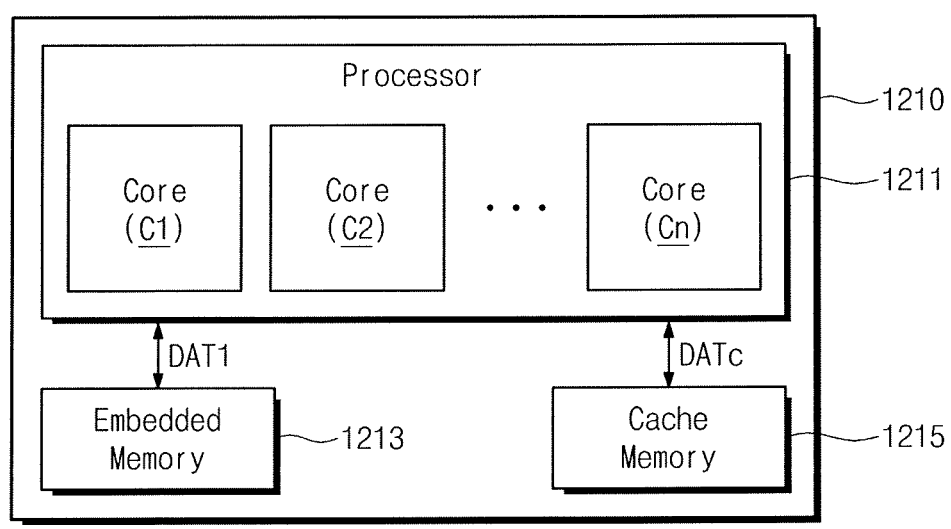
FIG. 7B is a block diagram illustrating an electronic device including a semiconductor device according to an example embodiment of the present inventive concept.

FIG. 7B is a block diagram illustrating an example of an electronic device including a semiconductor device according to an example embodiment of the present inventive concept.

Referring to FIG. 7B, an electronic device 1200 may include a semiconductor chip 1210. The semiconductor chip 1210 may include a processor 1211, an embedded memory 1213, and a cache memory 1215.

The processor 1211 may include one or more processor cores C1-Cn. The one or more processor cores C1-Cn may be configured to process data and signals. The processor cores C1-Cn may be configured to include the semiconductor device according to example embodiments of the present inventive concept.

The electronic device 1200 may be configured to perform its own functions using the processed data and signals. For example, the processor 1211 may be an application processor.

The embedded memory 1213 may exchange a first data DAT1 with the processor 1211. The first data DAT1 may be data processed, or to be processed, by the one or more processor cores C1-Cn. The embedded memory 1213 may manage the first data DAT1. For example, the embedded memory 1213 may be used for a buffering operation on first data DAT1. In other words, the embedded memory 1213 may be operated as a buffer memory or a working memory for the processor 1211.

In example embodiments, the electronic device 1200 may be used to realize a wearable electronic device. In general, the wearable electronic device may be configured to perform an operation of calculating a small amount of data, rather than calculating a large amount of data. In this sense, in the case where the electronic device 1200 is used for a wearable electronic device, the embedded memory 1213 may be configured to have a relatively small buffer capacity.

The embedded memory 1213 may be a static random access memory (SRAM) device. The SRAM device may have a faster operating speed than that of a dynamic random access memory (DRAM) device. Accordingly, in the case where the SRAM is embedded in the semiconductor chip 1210, it is possible for the electronic device 1200 to have a small size and a fast operating speed. Furthermore, in the case where the SRAM is embedded in the semiconductor chip 1210, it is possible to reduce an active power of the electronic device 1200. For example, the SRAM may include the semiconductor device according to example embodiments of the present inventive concept.

The cache memory 1215 may be mounted on the semiconductor chip 1210, along with the one or more processor cores C1-Cn. The cache memory 1215 may be configured to store cache data DATc that will be used or directly accessed by the one or more processor cores C1-Cn. The cache memory 1215 may be configured to have a relatively small capacity and a very fast operating speed. In example embodiments, the cache memory 1215 may include an SRAM device including the semiconductor device according to example embodiments of the present inventive concept. In the case where the cache memory 1215 is used, it is possible to reduce an access frequency or an access time to the embedded memory 1213 performed by the processor 1211. In other words, the use of the cache memory 1215 may allow the electronic device 1200 to have a fast operating speed.

To provide better understanding of an example embodiment of the present inventive concept, the cache memory 1215 is illustrated in FIG. 7B to be a component separated from the processor 1211. However, the cache memory 1215 may be configured to be included in the processor 1211. In addition, an example embodiment of the present inventive concept is not limited to the example illustrated by FIG. 5B.

The processor 1211, the embedded memory 1213, and the cache memory 1215 may be configured to exchange or transmit data, based on at least one of various interface protocols. For example, the processor 1211, the embedded memory 1213, and the cache memory 1215 may be configured to exchange or transmit data, based on at least one of Universal Serial Bus (USB), Small Computer System Interface (SCSI), Peripheral Component Interconnect (PCI) Express, Advanced Technology Attachment (ATA), Parallel ATA (PATA), Serial ATA (SATA), Serial Attached SCSI (SAS), Integrated Drive Electronics (IDE), or Universal Flash Storage (UFS).

Figure 7C:
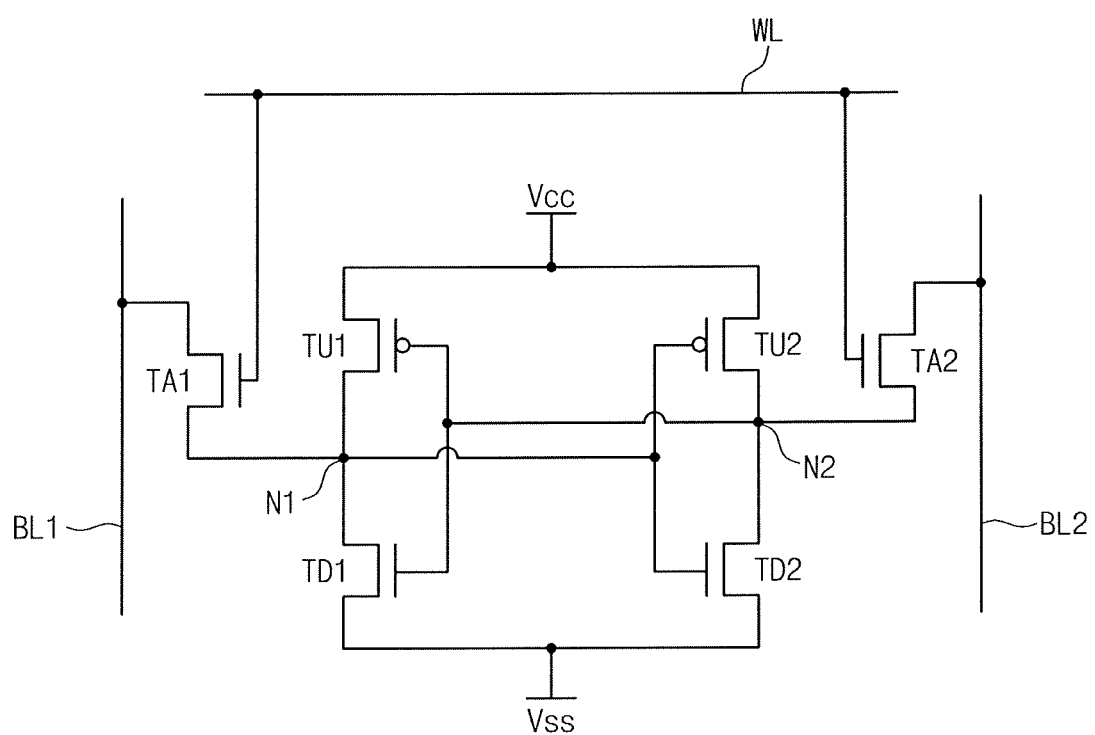
FIG. 7C is an equivalent circuit diagram illustrating a static random access memory (SRAM) cell according to an example embodiment of the present inventive concept.

FIG. 7C is an equivalent circuit diagram illustrating an SRAM cell according to an example embodiment of the present inventive concept. The SRAM cell may be realized by the semiconductor device according to example embodiments of the present inventive concept. The SRAM cell may be used for the embedded memory 1213 and/or the cache memory 1215 of FIG. 7B.

Referring to FIG. 7C, the SRAM cell may include a first pull-up transistor TU1, a first pull-down transistor TD1, a second pull-up transistor TU2, a second pull-down transistor TD2, a first access transistor TA1, and a second access transistor TA2. The first and second pull-up transistors TU1 and TU2 may be PMOS transistors, whereas the first and second pull-down transistors TD1 and TD2 and the first and second access transistors TA1 and TA2 may be NMOS transistors.

A first source/drain of the first pull-up transistor TU1 and a first source/drain of the first pull-down transistor TD1 may be connected to a first node N1. A second source/drain of the first pull-up transistor TU1 may be connected to a power line Vcc, and a second source/drain of the first pull-down transistor TD1 may be connected to a ground line Vss. A gate of the first pull-up transistor TU1 and a gate of the first pull-down transistor TD1 may be electrically connected to each other. Accordingly, the first pull-up transistor TU1 and the first pull-down transistor TD1 may constitute a first inverter. The mutually-connected gates of the first pull-up transistor TU1 and the first pull-down transistor TD1 may serve as an input terminal of the first inverter, and the first node N1 may serve as an output terminal of the first inverter.

A first source/drain of the second pull-up transistor TU2 and a first source/drain of the second pull-down transistor TD2 may be connected to the second node N2. A second source/drain of the second pull-up transistor TU2 may be connected to the power line Vcc, and a second source/drain of the second pull-down transistor TD2 may be connected to the ground line Vss. A gate of the second pull-up transistor TU2 and a gate of the second pull-down transistor TD2 may be electrically connected to each other. Accordingly, the second pull-up transistor TU2 and the second pull-down transistor TD2 may constitute a second inverter. The mutually-connected gates of the second pull-up transistor TU2 and the second pull-down transistor TD2 may serve as an input terminal of the second inverter, the second node N2 may serve as an output terminal of the second inverter.

The first and second inverters may be coupled with each other to form a latch structure. For example, the gates of the first pull-up transistor TU1 and the first pull-down transistor TD1 may be electrically connected to the second node N2, and the gates of the second pull-up and second pull-down transistors TU2 and TD2 may be electrically connected to the first node N1. The first source/drain of the first access transistor TA1 may be connected to the first node N1, and the second source/drain of the first access transistor TA1 may be connected to a first bit line BL1. The first source/drain of the second access transistor TA2 may be connected to the second node N2, and the second source/drain of the second access transistor TA2 may be connected to a second bit line BL2. The gates of the first and second access transistors TA1 and TA2 may be electrically coupled to a word line WL. The SRAM cell according to an example embodiment of the present inventive concept may have the afore-described structure, but an example embodiment of the present inventive concept is not limited thereto.

Figure 8A:
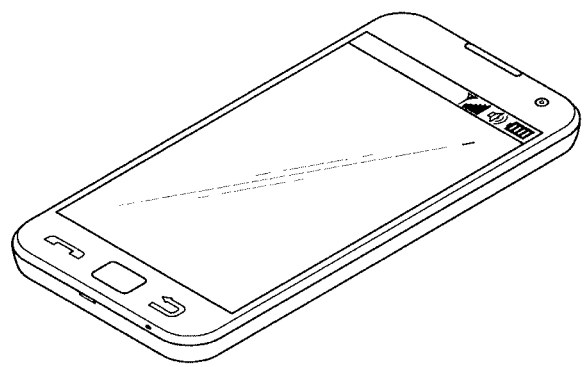
FIGS. 8A through 8C are diagrams illustrating a multimedia device including a semiconductor device according to an example embodiment of the present inventive concept.
Figure 8B:
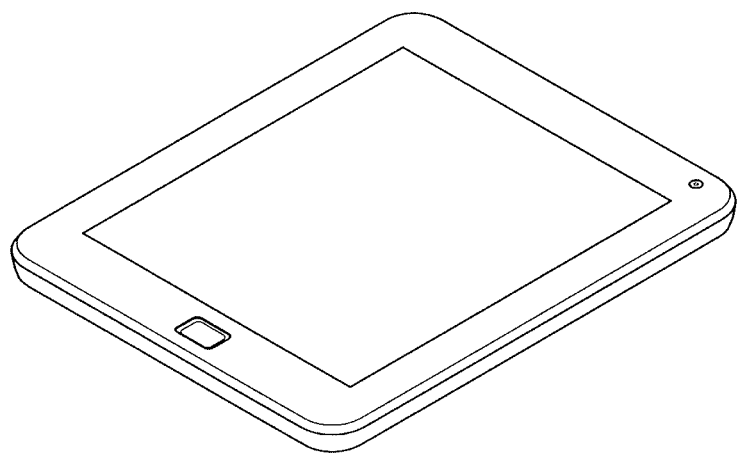
Figure 8C:
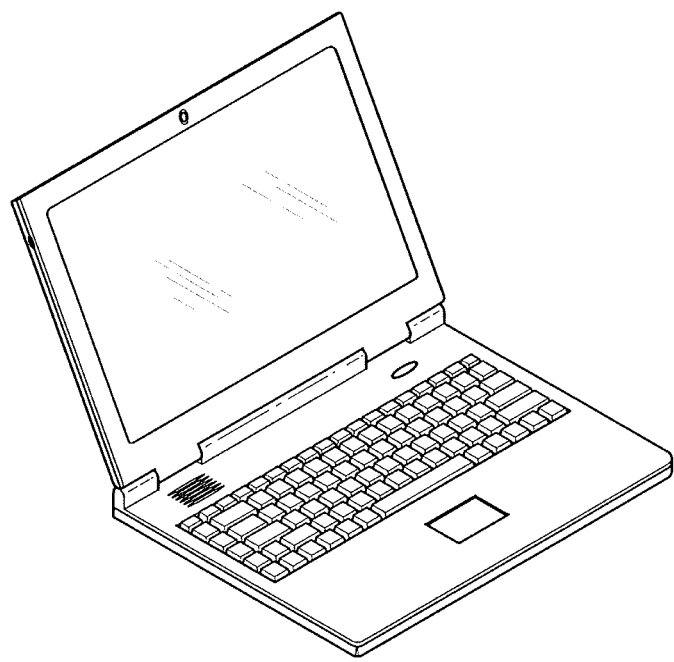

FIGS. 8A through 8C are diagrams illustrating some examples of a multimedia device including a semiconductor device according to an example embodiment of the present inventive concept. The electronic system 1100 of FIG. 7A and/or the electronic device 1200 of FIG. 7B may be applied to a mobile or smart phone 2000 shown in FIG. 8A, to a tablet or smart tablet PC 3000 shown in FIG. 8B, or to a laptop computer 4000 shown in FIG. 8C.

According to an example embodiment of the present inventive concept, a capping pattern may be formed on a source/drain pattern, and thus, it is possible to protect the source/drain pattern against a damage which may occur in a process of fabricating a semiconductor device. Furthermore, it is possible to prevent or suppress a short circuit from being formed between the source/drain pattern and the gate pattern. The capping pattern may be formed through a process of removing germanium atoms from a surface of the source/drain pattern, and thus, it is possible to prevent by-products from being formed in a process of forming the capping pattern. Since the capping pattern can be formed to a conformal thickness, it can be removed by an etching process for forming a contact hole. Accordingly, it is possible to improve an electric resistance property between the contact plug and the source/drain pattern. According to an example embodiment of the present inventive concept, the semiconductor device can have improved reliability.

While the present inventive concept has been shown and described with reference to example embodiments thereof, it will be apparent to those of ordinary skill in the art that various changes in form and detail may be made therein without departing from the spirit and scope of the inventive concept as defined by the following claims.

What is claimed is:

1. A method of fabricating a semiconductor device, comprising:
   forming a source/drain pattern on a substrate, the source/drain pattern containing a plurality of silicon atoms and a plurality of germanium atoms; and
   forming a capping pattern on the source/drain pattern,
   wherein the forming a capping pattern comprises removing part of the plurality of germanium atoms of the source/drain pattern.

2. The method of claim 1,
   wherein the forming of the capping pattern comprises:
   supplying a hydrogen gas onto the source/drain pattern to remove the part of the plurality of germanium atoms of the source/drain pattern.

3. The method of claim 1,
   wherein the removing of the part of the plurality of germanium atoms of the source/drain pattern comprises:
   generating a reaction gas including at least one of hydrogen radical, hydrogen anion, and hydrogen cation from a hydrogen gas, and wherein the reaction gas reacts with the part of the plurality of germanium atoms so that the the part of the plurality of germanium atoms is removed from the source/drain pattern.

4. The method of claim 3,
wherein the reaction gas reacts with the part of the plurality of germanium atoms at a temperature lower than a temperature at which the source/drain pattern is formed.

5. The method of claim 1,
wherein the forming a source/drain pattern is performed by an epitaxial growth process.

6. The method of claim 1,
wherein the source/drain pattern comprises:
a first portion including a first surface having a crystal plane {111}; and
a second portion including a second surface which is different from the first surface having the crystal plane {111}.

7. The method of claim 6,
wherein the part of the plurality of germanium atoms is removed along the first surface and the second surface of the source/drain pattern.

8. The method of claim 1,
wherein the source/drain pattern further comprises group-V dopants.

9. The method of claim 1, further comprising:
forming an interlayered insulating layer on the capping pattern;
forming a contact hole to penetrate the interlayered insulating layer and expose the source/drain pattern; and
forming a contact plug in the contact hole.

10. A method of fabricating a semiconductor device, comprising:
providing a substrate with an active pattern;
forming a sacrificial gate pattern on the active pattern;
removing a portion of the active pattern adjacent to the sacrificial gate pattern to form a recessed active pattern;
forming a source/drain pattern on the recessed active pattern, wherein the source/drain pattern includes a plurality of germanium atoms; and
forming a capping pattern in the source/drain pattern by removing part of the germanium atoms from the source/drain pattern.

11. The method of claim 10,
wherein the forming a capping pattern comprises:
supplying reaction gas onto the source/drain pattern, and
wherein the reaction gas is reacted with the germanium atoms in a surface of the source/drain pattern.

12. The method of claim 10,
wherein the forming a capping pattern comprises performing a hydrogen plasma treatment process on the source/drain pattern at a lower temperature than a temperature at which the source/drain pattern is formed.

13. The method of claim 10,
wherein the source/drain pattern further comprises a plurality of silicon atoms.

14. The method of claim 10, further comprising:
forming a device isolation pattern on the substrate to cover a lower sidewall of the active pattern;
forming an interlayered insulating layer on the device isolation pattern to cover the capping pattern at both sides of the sacrificial gate pattern;
removing the sacrificial gate pattern to form an opening exposing the active pattern;
forming a gate pattern in the opening;
forming a contact hole in the interlayered insulating layer to expose the source/drain pattern; and
filling the contact hole with a conductive material to form a contact plug electrically connected to the source/drain pattern.

15. The method of claim 14,
wherein the source/drain pattern comprises:
a first portion provided on the recessed active pattern; and
a second portion provided on the device isolation pattern and to have a crystal plane different from the first portion.

16. A method of fabricating a semiconductor device, comprising:
forming an active pattern disposed on a substrate and extended in a first direction;
forming a gate pattern disposed on a first region of the active pattern and extended in a second direction different from the first direction; forming a source/drain pattern disposed on a second region of the active pattern, wherein the second region of the active pattern is adjacent to the gate pattern and the source/drain pattern has a first concentration of germanium atoms;
forming a first capping pattern covering the source/drain pattern,
wherein the first capping pattern has a second concentration of germanium atoms smaller than the first concentration of germanium atoms; and
forming a contact plug penetrating the first capping pattern to be in contact with the source/drain pattern.

17. The method of claim 16,
wherein a difference between the second concentration of germanium atoms and the first concentration of germanium atoms is about 3 atomic percent or more.

18. The method of claim 16,
wherein the second region of the active pattern is recessed to form a recessed second region of the active pattern, and
wherein the source/drain pattern is disposed in the recessed second region of the active pattern.

* * * * *